(12) United States Patent
Uchida

(10) Patent No.: US 8,507,928 B2  
(45) Date of Patent: Aug. 13, 2013

(54) ORGANIC EL DEVICE, METHOD FOR MANUFACTURING ORGANIC EL DEVICE, AND ELECTRONIC DEVICE

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 12/912,143

(22) Filed: Oct. 26, 2010

(65) Prior Publication Data

US 2011/0101888 A1 May 5, 2011

(30) Foreign Application Priority Data

Nov. 4, 2009 (JP) ................ 2009-252710

(51) Int. Cl.
H01L 29/20 (2006.01)
H01L 33/00 (2010.01)

(52) U.S. Cl.
USPC .. 257/89; 438/36; 257/E51.018; 257/E51.022

(58) Field of Classification Search
USPC .......................... 257/89, E51.022
See application file for complete search history.

(56) References Cited

U.S. PATENT DOCUMENTS

| 6,712,661 | B1 * | 3/2004 | Kiguchi et al. | 445/24 |
| 2002/0155215 | A1 * | 10/2002 | Miyashita et al. | 427/66 |
| 2005/0052590 | A1 * | 3/2005 | Ochiai et al. | 349/71 |
| 2005/0260335 | A1 * | 11/2005 | Kimura et al. | 427/58 |
| 2006/0170339 | A1 * | 8/2006 | Kanno et al. | 313/506 |

FOREIGN PATENT DOCUMENTS

JP A-2007-73532 3/2007

* cited by examiner

*Primary Examiner* — Michelle Mandala  
*Assistant Examiner* — Shaka White  
(74) *Attorney, Agent, or Firm* — Oliff & Berridge, PLC

(57) ABSTRACT

An organic EL device includes a first organic EL element and a second organic EL element on an underlying layer that includes a first drive circuit unit for driving the first organic EL element and a second drive circuit unit for driving the second organic EL element. The organic EL device includes a partition on the underlying layer defining a first region including a first light-emitting layer of the first organic EL element and a second region including a second light-emitting layer of the second organic EL element. The partition defines the first film-forming region such that the first film-forming region includes the first drive circuit unit and the second film-forming region such that the second film-forming region does not include at least part of the second drive circuit unit. The first light-emitting layer is formed by a different method from that used for the second light-emitting layer.

16 Claims, 17 Drawing Sheets

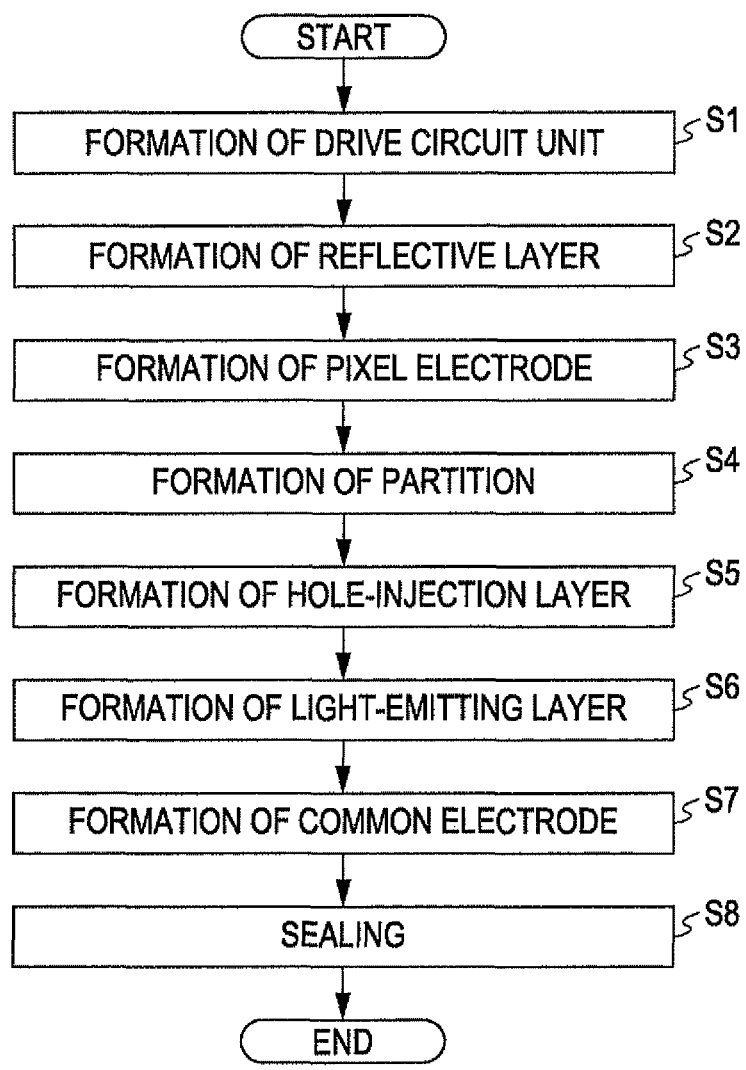

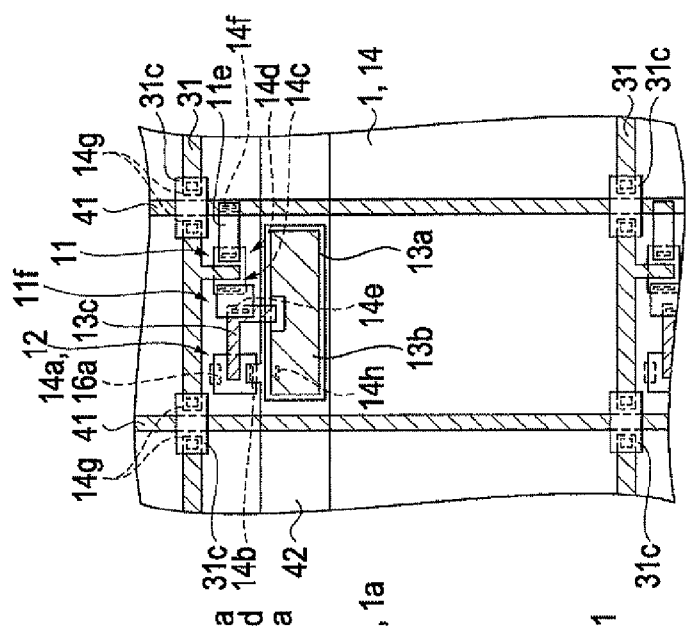
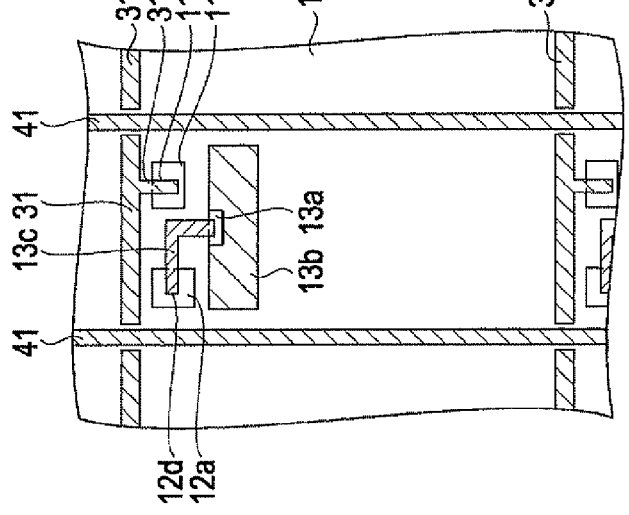
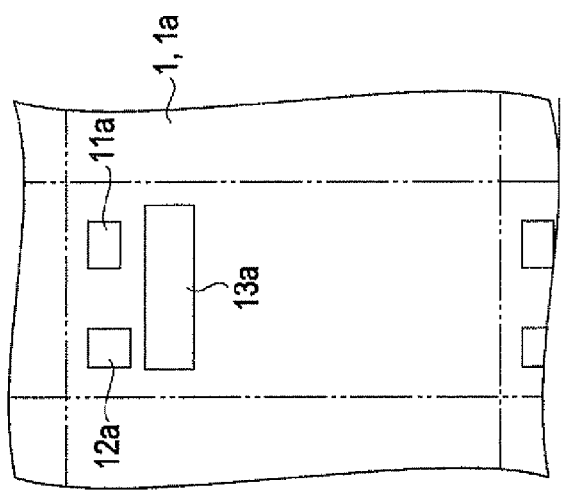

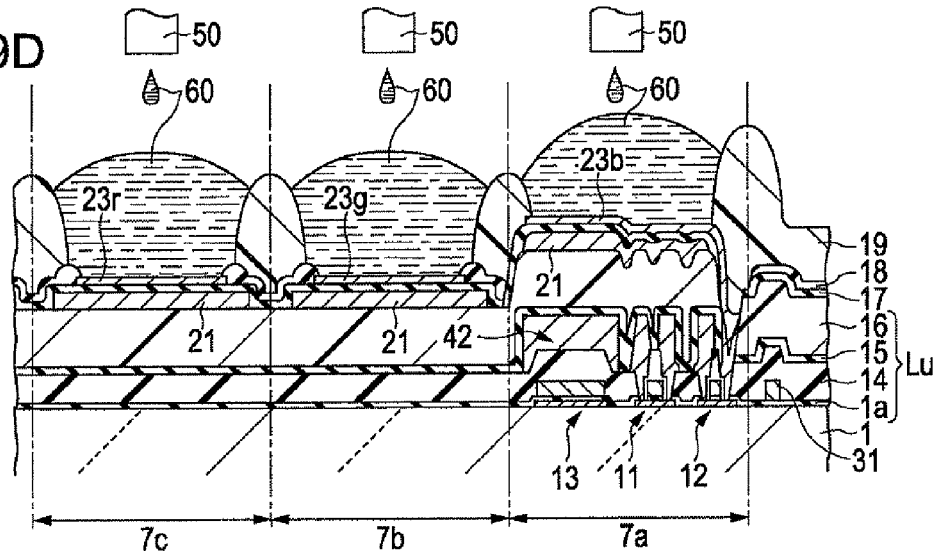
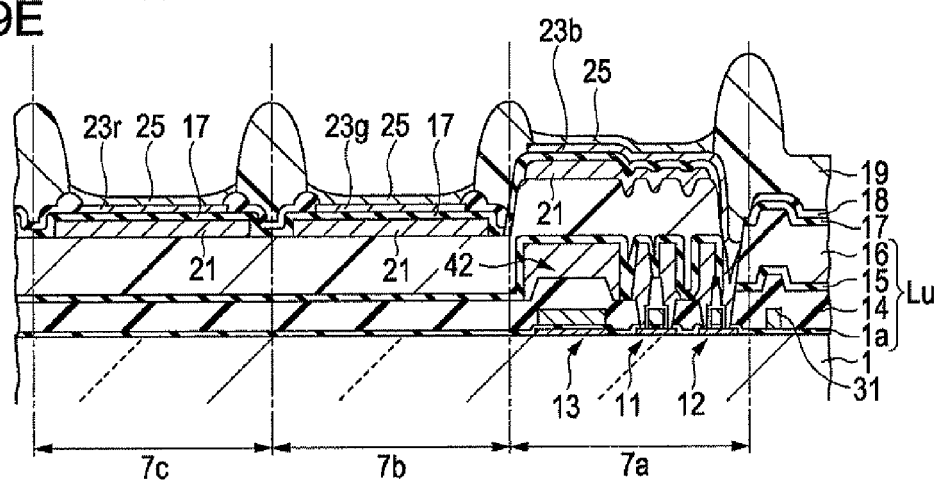
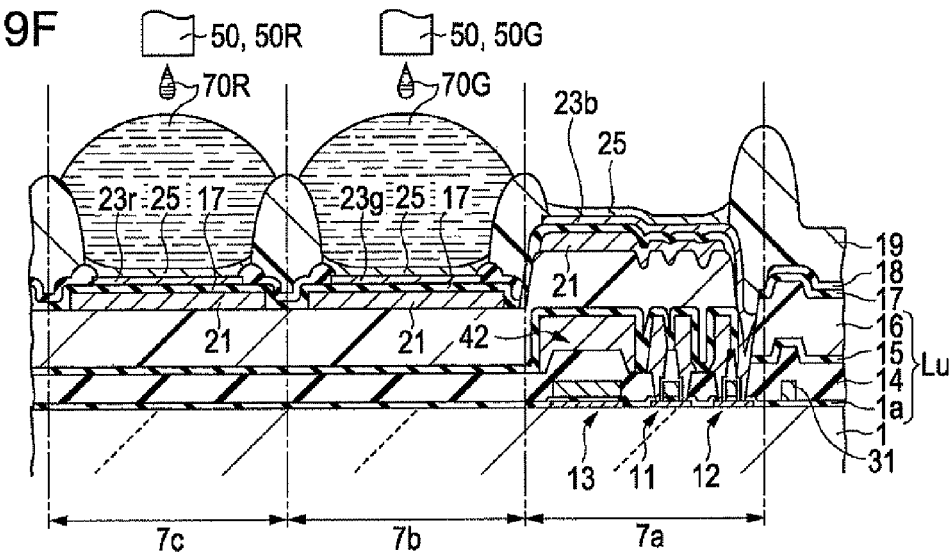

ORGANIC EL DEVICE, METHOD FOR MANUFACTURING ORGANIC EL DEVICE, AND ELECTRONIC DEVICE

BACKGROUND

1. Technical Field

The present invention relates to an organic electroluminescence (EL) device that includes an organic EL element, a method for manufacturing an organic EL device, and an electronic device.

2. Related Art

An exemplary known organic EL device is an organic EL display that includes a first pixel electrode, a second pixel electrode, and a third pixel electrode on a substrate, a resin wall for separating these pixel electrodes, a first organic light-emitting layer for emitting red light disposed between the first pixel electrode and a counter electrode, a second organic light-emitting layer for emitting green light disposed between the second pixel electrode and the counter electrode, and a third organic light-emitting layer for emitting blue light disposed on the first organic light-emitting layer, the second organic light-emitting layer, the third pixel electrode, and the resin wall (JP-A-2007-73532).

The first organic red-light-emitting layer and the second organic green-light-emitting layer are formed by an ink jet method, and the third organic blue-light-emitting layer is formed by a vacuum evaporation method. The third organic blue-light-emitting layer may be formed by a coating method other than an ink jet method. Examples of the coating method include spin coating, casting, dipping, bar coating, and roll coating.

When a liquid containing a functional material is applied to an uneven film-forming region to form an organic light-emitting layer composed of the functional material, however, it is difficult to achieve a constant film thickness by these coating methods, including the ink jet method. Variations in the thickness of the organic light-emitting layer result in variations in luminance.

In organic light-emitting materials to which a coating method can be applied, another problem is that the emission lifetime of blue light is shorter than red or green light.

SUMMARY

The invention has been achieved to solve at least part of the problems described above and can be implemented in accordance with the following embodiments or aspects.

[Aspect 1] An organic EL device according to the present aspect includes a first organic EL element, a second organic EL element, and a third organic EL element of different luminescent colors disposed adjacent to each other on an underlying layer including a substrate. The underlying layer includes a first drive circuit unit for driving the first organic EL element, a second drive circuit unit for driving the second organic EL element, and a third drive circuit unit for driving the third organic EL element. The organic EL device further includes a partition defining a first film-forming region, a second film-forming region, and a third film-forming region on the underlying layer. The first film-forming region includes a first light-emitting layer of the first organic EL element. The second film-forming region includes a second light-emitting layer of the second organic EL element. The third film-forming region includes a third light-emitting layer of the third organic EL element. The partition defines the first film-forming region such that the first film-forming region includes the first drive circuit unit, the second film-forming region such that the second film-forming region does not include at least part of the second drive circuit unit, and the third film-forming region such that the third film-forming region does not include at least part of the third drive circuit unit. The first light-emitting layer is formed by a different method from that used for the second light-emitting layer and the third light-emitting layer.

In this structure, the second film-forming region and the third film-forming region are defined by the partition so as not to include at least part of the second drive circuit unit and the third drive circuit unit, respectively. The surface of the underlying layer in the second film-forming region and the third film-forming region is therefore flatter than in the first film-forming region defined by the partition so as to include the first drive circuit unit. Variations in the thickness of a film formed can be reduced by making a method for forming the first light-emitting layer in the first film-forming region different from a method for forming the second light-emitting layer in the second film-forming region and a method for forming the third light-emitting layer in the third film-forming region in a manner that depends on the flatness of the underlying layer. Thus, there is provided an organic EL device that includes first to third organic EL elements, each of which includes a light-emitting layer having a predetermined thickness, and that has stable luminescence properties.

[Aspect 2] In the organic EL device according to the preceding aspect, the second light-emitting layer and the third light-emitting layer are preferably formed by a liquid discharge method. The second light-emitting layer emits green light, and the third light-emitting layer emits red light. The first light-emitting layer is preferably formed by a vapor deposition method on the second light-emitting layer and the third light-emitting layer. The first light-emitting layer emits blue light.

In this structure, the first light-emitting layer for emitting blue light is formed in the first film-forming region including the first drive circuit unit by a vapor deposition method, which is little affected by the flatness of the underlying layer. In the second film-forming region and the third film-forming region, which has a flatter underlying layer than the first film-forming region, the second light-emitting layer for emitting green light and the third light-emitting layer for emitting red light are formed by a liquid discharge method. The first light-emitting layer to the third light-emitting layer can therefore have a predetermined thickness. Thus, there is provided an organic EL device that can emit blue, green, and red light at stable luminance.

[Aspect 3] In the organic EL device according to any one of the preceding aspects, the first light-emitting layer preferably has hole-transport characteristics.

Thus, the first light-emitting layer formed by a vapor deposition method can efficiently emit blue light.

[Aspect 4] In the organic EL device according to any one of the preceding aspects, the first light-emitting layer preferably has hole-transport characteristics and electron-transport characteristics.

Thus, the first light-emitting layer formed by a vapor deposition method can efficiently emit blue light. Furthermore, since the first light-emitting layer has electron-transport characteristics as well as hole-transport characteristics, the first light-emitting layer disposed on the second light-emitting layer and the third light-emitting layer does not interfere with charge injection into the second light-emitting layer and the third light-emitting layer. Thus, the second light-emitting layer and the third light-emitting layer can stably emit light.

[Aspect 5] In the organic EL device according to any one of the preceding aspects, the partition preferably defines the first film-forming region such that the first film-forming region has a larger area than each of the second film-forming region and the third film-forming region.

Since a blue luminescent material tends to have a shorter emission lifetime than a green or red luminescent material, when the first film-forming region in which the blue-light-emitting layer is formed has a larger area than the other film-forming regions, the emission lifetimes of different luminescent colors are well balanced. Thus, there is provided an organic EL device having a longer emission lifetime.

The term "emission lifetime", as used herein, refers to the elapsed time until the luminance of an organic EL element reduces to a predetermined value (for example, approximately half of the initial value) while a predetermined electric current is applied to the organic EL element to intermittently or continuously emit light. The luminance depends on the electric current passing through a light-emitting layer and the luminous area. Thus, a larger luminous area requires a smaller electric current to achieve intended luminance. The emission lifetime depends on the electric current passing through a light-emitting layer. More specifically, the emission lifetime increases with decreasing electric current.

[Aspect 6] In the organic EL device according to any one of the preceding aspects, preferably, the partition includes a first partition formed of an inorganic material and a second partition formed of an organic material, the first film-forming region is defined by the second partition alone, and the second film-forming region and the third film-forming region are individually defined by the second partition disposed on the first partition.

Thus, as compared with a first film-forming region defined by a two-layer partition composed of a first partition and a second partition, the first film-forming region can easily have a larger area than the second film-forming region or the third film-forming region without changing the arrangement of the first to third organic EL elements.

[Aspect 7] In the organic EL device according to any one of the preceding aspects, the partition may include a first partition formed of an inorganic material and a second partition formed of an organic material, the first film-forming region may be defined by the second partition alone, and a substantial light-emitting region of at least one of the second film-forming region and the third film-forming region may be defined by the first partition, and the second partition may be disposed on the first partition to include a plurality of light-emitting regions.

Thus, as compared with the second film-forming region or the third film-forming region individually defined by the second partition, light-emitting layers of the same luminescent color can be formed in a larger area. Thus, in the formation of the second light-emitting layer and the third light-emitting layer by a liquid discharge method, a liquid containing a functional material can be applied to a larger area, allowing the light-emitting layer to have a constant thickness (cross-sectional shape) after drying.

[Aspect 8] In the organic EL device according to any one of the preceding aspects, preferably, each of the first drive circuit unit, the second drive circuit unit, and the third drive circuit unit includes a thin-film transistor, a retention capacitor, and a line connected between the thin-film transistor and the retention capacitor, and the partition defines the second film-forming region and the third film-forming region such that the second film-forming region and the third film-forming region do not include at least the thin-film transistor.

The thin-film transistor includes a semiconductor layer and various electrodes stacked on and connected to the semiconductor layer. Thus, a portion of the underlying layer including the thin-film transistor tends to have a difference in level on the surface. In the structure according to the present aspect, the second film-forming region and the third film-forming region are defined by the partition so as not to include the thin-film transistor. Thus, the underlying layer in the second film-forming region and the third film-forming region has a flat surface, that is, a surface suitable for a liquid discharge method.

[Aspect 9] In the organic EL device according to any one of the preceding aspects, each of the first drive circuit unit, the second drive circuit unit, and the third drive circuit unit may include a thin-film transistor, a retention capacitor, and a line connected between the thin-film transistor and the retention capacitor, and the partition may define the second film-forming region and the third film-forming region such that the second film-forming region and the third film-forming region include neither the thin-film transistor nor the retention capacitor.

The underlying layer in the second film-forming region and the third film-forming region including neither the thin-film transistor nor the retention capacitor can have a flatter surface.

[Aspect 10] A method for manufacturing an organic EL device according to the present aspect is a method for manufacturing an organic EL device that includes a first organic EL element, a second organic EL element, and a third organic EL element of different luminescent colors disposed adjacent to each other on an underlying layer including a substrate. The method includes forming a first drive circuit unit for driving the first organic EL element, a second drive circuit unit for driving the second organic EL element, and a third drive circuit unit for driving the third organic EL element on the substrate, forming a partition that defines a first film-forming region, a second film-forming region, and a third film-forming region on the substrate, the first film-forming including the first drive circuit unit, the second film-forming region not including at least part of the second drive circuit unit, the third film-forming region not including at least part of the third drive circuit unit, and forming a first light-emitting layer of the first organic EL element in the first film-forming region, forming a second light-emitting layer of the second organic EL element in the second film-forming region, and forming a third light-emitting layer of the third organic EL element in the third film-forming region. The first light-emitting layer is formed by a different method from that used for the second light-emitting layer and the third light-emitting layer.

In this method, the second film-forming region and the third film-forming region are defined by the partition so as not to include at least part of the second drive circuit unit and the third drive circuit unit, respectively. The surface of the underlying layer in the second film-forming region and the third film-forming region is therefore flatter than in the first film-forming region defined by the partition so as to include the first drive circuit unit. Variations in the thickness of a film formed can be reduced by making a method for forming the first light-emitting layer in the first film-forming region different from a method for forming the second light-emitting layer in the second film-forming region and a method for forming the third light-emitting layer in the third film-forming region in a manner that depends on the flatness of the underlying layer. Thus, an organic EL device that includes first to third organic EL elements, each of which includes a light-emitting layer having a predetermined thickness, and that has stable luminescence properties can be manufactured.

[Aspect 11] In the method for manufacturing an organic EL device according to the preceding aspect, preferably, the second light-emitting layer and the third light-emitting layer are formed by a liquid discharge method, and the first light-emitting layer is formed by a vapor deposition method to cover the second light-emitting layer and the third light-emitting layer. The second light-emitting layer emits green light, the third light-emitting layer emits red light, and the first light-emitting layer emits blue light.

In this method, the first light-emitting layer for emitting blue light is formed in the first film-forming region including the first drive circuit unit by a vapor deposition method, which is little affected by the flatness of the underlying layer. In the second film-forming region and the third film-forming region, which has a flatter underlying layer than the first film-forming region, the second light-emitting layer for emitting green light and the third light-emitting layer for emitting red light are formed by a liquid discharge method. The first light-emitting layer to the third light-emitting layer therefore have a predetermined thickness. Thus, an organic EL device that can emit blue, green, and red light at stable luminance can be manufactured. Furthermore, the first light-emitting layer is formed by a vapor deposition method to cover the second light-emitting layer and the third light-emitting layer selectively formed by a liquid discharge method. This can obviate the necessity of a deposition mask used to selectively form the first light-emitting layer in a predetermined region, thus simplifying the process.

[Aspect 12] In the method for manufacturing an organic EL device according to any one of the preceding aspects, preferably, the first light-emitting layer has hole-transport characteristics and electron-transport characteristics and is formed by a vapor deposition method.

In an organic EL device manufactured by this method, the first light-emitting layer formed by a vapor deposition method can efficiently emit blue light. Furthermore, since the first light-emitting layer has electron-transport characteristics as well as hole-transport characteristics, the first light-emitting layer disposed on the second light-emitting layer and the third light-emitting layer does not interfere with charge injection into the second light-emitting layer and the third light-emitting layer. Thus, the second light-emitting layer and the third light-emitting layer can stably emit light.

[Aspect 13] In the method for manufacturing an organic EL device according to any one of the preceding aspects, preferably, the partition is formed such that the first film-forming region has a larger area than each of the second film-forming region and the third film-forming region.

Thus, the first film-forming region including the blue-light-emitting layer having a shorter emission lifetime than the other luminescent colors has a larger area than the other film-forming regions. The emission lifetimes of different luminescent colors are therefore well balanced. Thus, an organic EL device having a longer emission lifetime can be manufactured.

[Aspect 14] In the method for manufacturing an organic EL device according to any one of the preceding aspects, preferably, the partition includes a first partition formed of an inorganic material and a second partition formed of an organic material, the first partition defines the second film-forming region and the third film-forming region, and the second partition is disposed on the first partition and defines the first film-forming region.

Thus, as compared with a first film-forming region defined by a two-layer partition composed of a first partition and a second partition, the first film-forming region can easily have a larger area than the second film-forming region or the third film-forming region without changing the arrangement of the first to third organic EL elements.

[Aspect 15] In the method for manufacturing an organic EL device according to any one of the preceding aspects, the partition may include a first partition formed of an inorganic material and a second partition formed of an organic material, the second partition may define the first film-forming region, the first partition may define a substantial light-emitting region of at least one of the second film-forming region and the third film-forming region, and the second partition may be disposed on the first partition to include a plurality of light-emitting regions.

Thus, as compared with the second film-forming region or the third film-forming region individually defined by the second partition, light-emitting layers of the same luminescent color can be formed in a larger area. Thus, in the formation of the second light-emitting layer and the third light-emitting layer by a liquid discharge method, a liquid containing a functional material can be applied to a larger area, thus forming a light-emitting layer having a constant thickness (cross-sectional shape) after drying.

[Aspect 16] In the method for manufacturing an organic EL device according to any one of the preceding aspects, preferably, each of the first drive circuit unit, the second drive circuit unit, and the third drive circuit unit includes a thin-film transistor, a retention capacitor, and a line connected between the thin-film transistor and the retention capacitor, and the partition defines the second film-forming region and the third film-forming region such that the second film-forming region and the third film-forming region do not include at least the thin-film transistor.

Thus, the underlying layer in the second film-forming region and the third film-forming region has a flatter surface than in the first film-forming region, that is, a surface suitable for a liquid discharge method.

[Aspect 17] In the method for manufacturing an organic EL device according to any one of the preceding aspects, each of the first drive circuit unit, the second drive circuit unit, and the third drive circuit unit may include a thin-film transistor, a retention capacitor, and a line connected between the thin-film transistor and the retention capacitor, and the partition may define the second film-forming region and the third film-forming region such that the second film-forming region and the third film-forming region include neither the thin-film transistor nor the retention capacitor.

Thus, the underlying layer in the second film-forming region and the third film-forming region has a flatter surface than in the first film-forming region, allowing the formation of a light-emitting layer having a constant thickness (cross-sectional shape) after drying.

[Aspect 18] An electronic device according to the present aspect includes an organic EL device according to any one of the preceding aspects or an organic EL device manufactured by a method for manufacturing an organic EL device according to any one of the preceding aspects.

Thus, there is provided an electronic device that includes an organic EL device having stable luminescence properties (luminance properties) with small variations in luminescence (variations in luminance) and can therefore display clear images.

BRIEF DESCRIPTION OF THE DRAWINGS

The invention will be described with reference to the accompanying drawings, wherein like numbers reference like elements.

FIG. 7 is a flow chart of a method for manufacturing the organic EL device according to the first embodiment.

FIGS. 8A to 8C are schematic plan views illustrating a method for manufacturing an organic EL device.

FIGS. 9D to 9F are schematic cross-sectional views illustrating a method for manufacturing an organic EL device.

DESCRIPTION OF EXEMPLARY EMBODIMENTS

Embodiments of the invention will be described below with reference to the drawings. The drawings are appropriately enlarged or reduced for the sake of clarity.

First Embodiment

Organic EL Device

Figure 1:
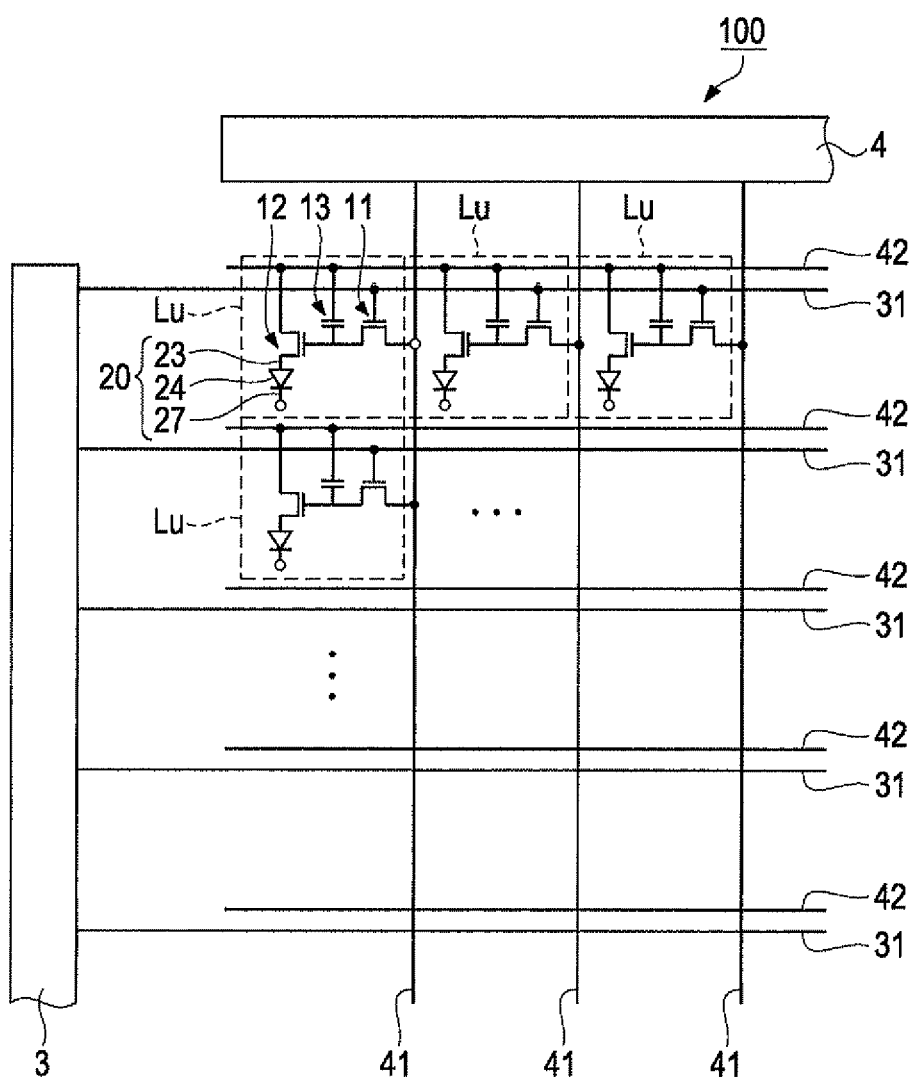
FIG. 1 is an equivalent circuit diagram of an organic EL device according to a first embodiment of the invention.
Figure 2:
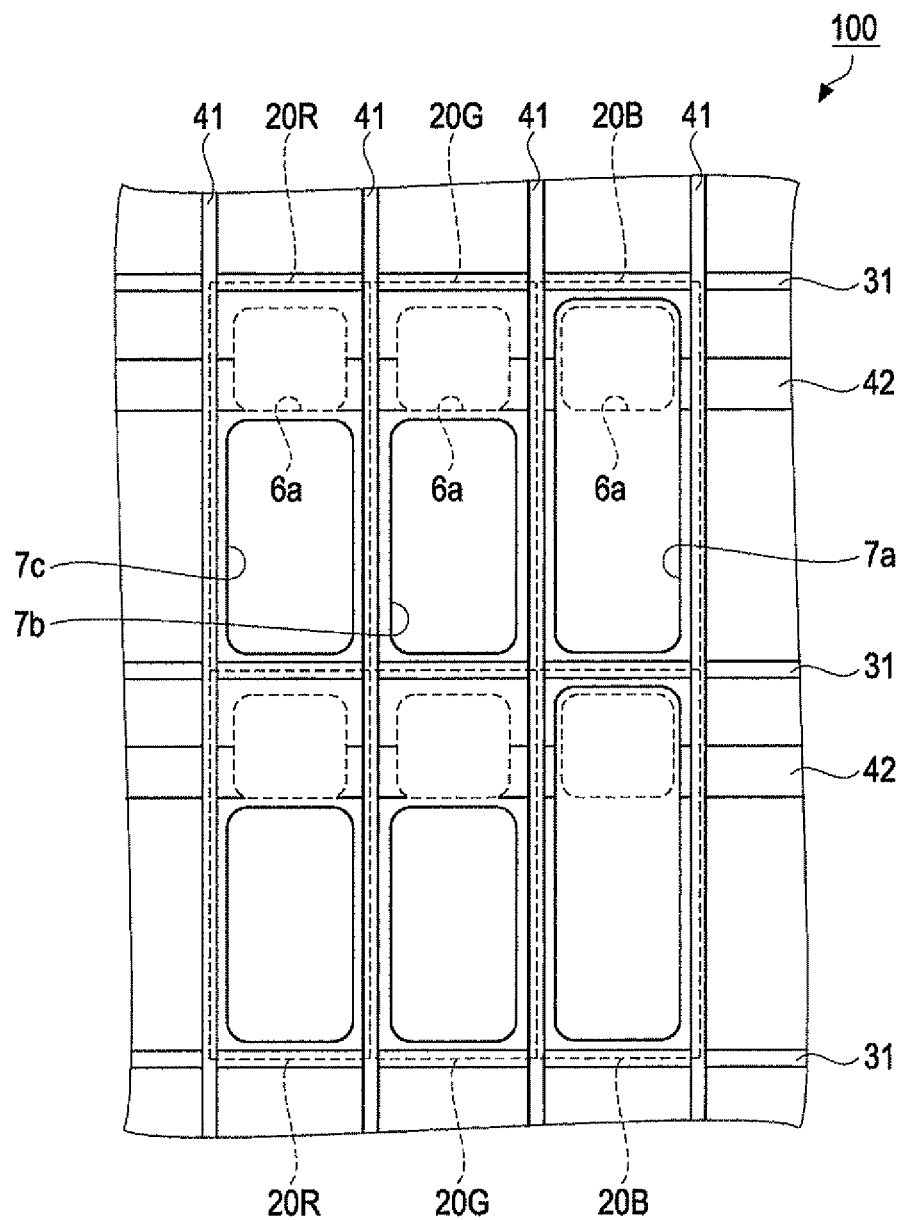
FIG. 2 is a schematic plan view of the arrangement of organic EL elements in the organic EL device according to the first embodiment.
Figure 3:
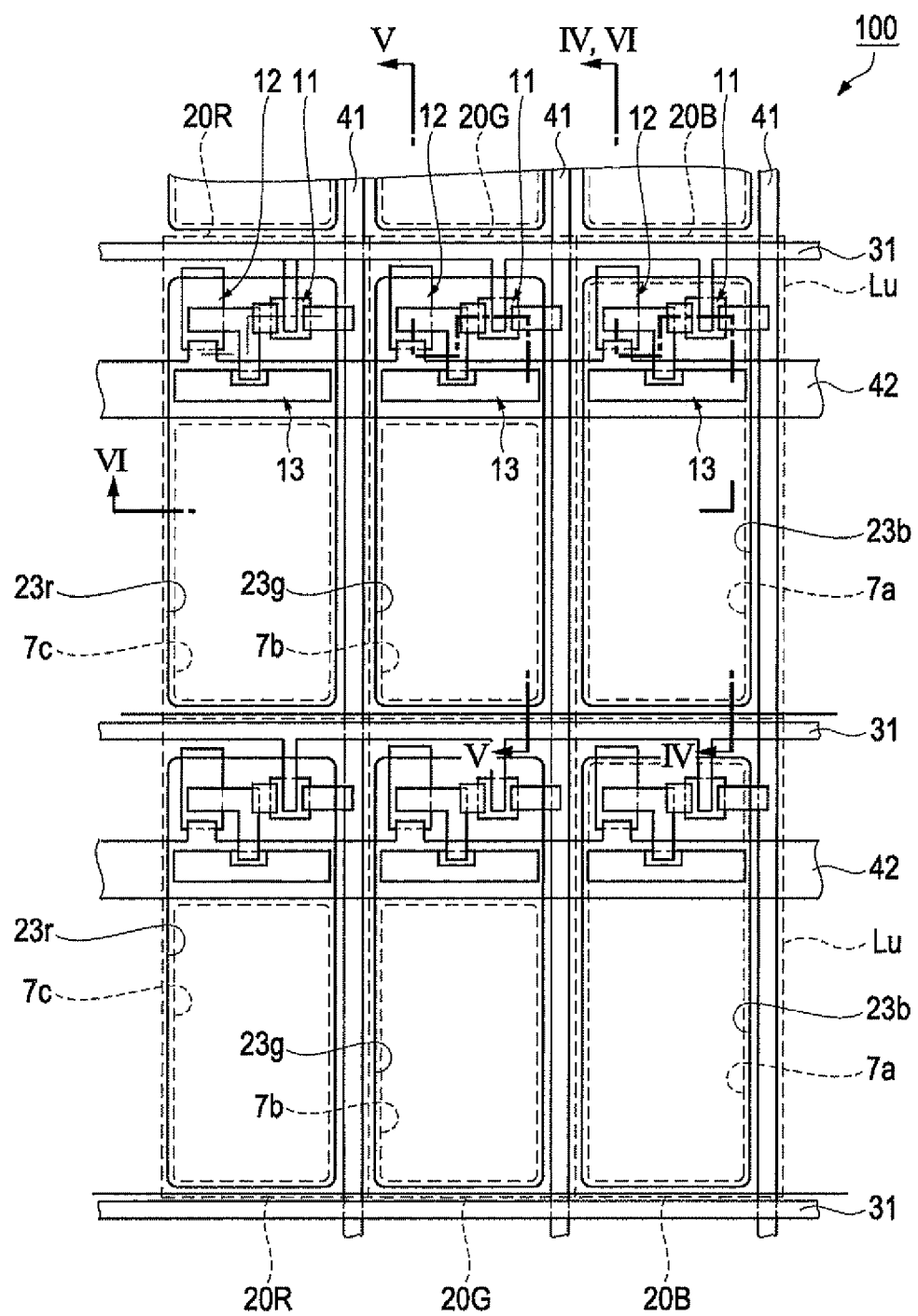
FIG. 3 is a schematic plan view of a drive circuit unit in the organic EL device according to the first embodiment.

An organic EL device according to the present embodiment will be described below with reference to FIGS. 1 to 3. FIG. 1 is an equivalent circuit diagram of an organic EL device according to a first embodiment of the invention. FIG. 2 is a schematic plan view of the arrangement of organic EL elements in the organic EL device. FIG. 3 is a schematic plan view of a drive circuit unit in the organic EL device.

As illustrated in FIG. 1, an organic EL device 100 according to the present embodiment is an active-matrix display apparatus that includes a thin-film transistor (hereinafter abbreviated as a TFT) as a switching element for driving an organic EL element 20, which functions as a light-emitting unit.

An organic EL device 100 includes a plurality of scanning lines 31 connected to a scanning-line drive 3, a plurality of data lines 41 connected to a data line drive 4, and a plurality of power supply lines 42 parallel to the scanning lines 31. Light-emission-control units Lus are disposed in regions defined by the scanning lines 31 and the data lines 41, which cross each other and are insulated from each other. The light-emission-control units Lus control the light emission of the organic EL elements 20.

Each of the light-emission-control units Lus includes a drive circuit unit. The drive circuit unit includes a switching TFT 11, a retention capacitor 13, and a driving TFT 12. In the switching TFT 11, scanning signals are sent to a gate electrode through the corresponding scanning line 31. The retention capacitor 13 stores pixel signals sent from the corresponding data line 41 through the TFT 11. The pixel signals stored in the retention capacitor 13 are sent to a gate electrode of the driving TFT 12.

Each of the organic EL elements 20 functioning as a light-emitting unit includes a pixel electrode 23, a common electrode 27, and a functional layer 24 disposed between the pixel electrode 23 and the common electrode 27. When the organic EL element 20 is electrically connected to the corresponding power supply line 42 through the driving TFT 12, the pixel electrode 23 functions as an anode into which a driving current flows from the power supply line 42, and the common electrode 27 functions as a cathode.

The scanning lines 31 and the data lines 41 to be connected to the TFTs 11 and 12 are collectively referred to as signal lines.

When a scanning line 31 is driven to turn on a switching TFT 11, a retention capacitor 13 holds the electric potential of a data line 41. The status of the retention capacitor 13 determines the on-off state of a driving TFT 12. An electric current flows from a power supply line 42 to a pixel electrode 23 through the driving TFT 12 and to a common electrode 27 through a functional layer 24. The functional layer 24 emits light in proportion to the electric current passing through the functional layer 24. The drive circuit unit of the light-emission-control unit Lu may have another structure and may include three or more thin-film transistors.

As illustrated in FIG. 2, the organic EL device 100 includes a first organic EL element 20B for emitting blue light, a second organic EL element 20G for emitting green light, and a third organic EL element 20R for emitting red light in their respective regions defined by the scanning lines 31 and the data lines 41, which cross each other. Of the three organic EL elements 20B, 20G, and 20R, organic EL elements for emitting the same color light are arranged on a substrate (not shown) in a vertical direction (along the data lines 41 in the drawing), and organic EL elements for emitting different color lights are arranged in a horizontal direction (along the scanning lines 31 in the drawing). The organic EL elements for emitting red (R), green (G), and blue (B) light may be arranged in any order in the horizontal direction.

The first organic EL element 20B includes a first light-emitting layer in a first film-forming region 7a. The second organic EL element 20G includes a second light-emitting layer in a second film-forming region 7b. The third organic EL element 20R includes a third light-emitting layer in a third film-forming region 7c.

In the drive circuit unit of the light-emission-control unit Lu described above, a region 6a indicated by a broken line includes the TFTs 11 and 12, the retention capacitor 13, and lines connected between the TFTs 11 and 12 and the retention capacitor 13. Thus, the region 6a includes at least the TFTs 11 and 12 and the retention capacitor 13.

The first film-forming region 7a is generally rectangular along the corresponding data lines 41 and includes the region 6a. The second film-forming region 7b is generally rectangular along the corresponding data lines 41 and does not include the region 6a. Likewise, the third film-forming region 7c is generally rectangular along the corresponding data lines 41 and does not include the region 6a. Thus, the first film-forming region 7a including the region 6a has a larger area than the second film-forming region 7b or the third film-forming region 7c, which does not include the region 6a.

The power supply lines 42 pass through the regions 6a along the scanning lines 31.

As illustrated in FIG. 3, each of the light-emission-control units Lus for driving the organic EL elements 20B, 20G, and 20R includes the switching TFT 11, the driving TFT 12, and the retention capacitor 13. The TFTs 11 and 12 are disposed in the vicinities of intersections of the scanning lines 31 and the data lines 41. Each of the TFTs 11 and 12 is provided with lines connected to the corresponding scanning line 31, data line 41, and retention capacitor 13, and a line connecting the TFT 11 (drain) with the TFT 12 (gate).

The driving TFT 12 controls an electric current flowing from the corresponding power supply line 42 to each of the organic EL elements 20B, 20G, and 20R while one (a source) of three terminals (a gate, the source, and a drain) is connected to the power supply line 42. The driving TFT 12 has a larger area than the TFT 11 for switching the organic EL elements 20B, 20G, and 20R in consideration of resistance to electric current and voltage. The retention capacitor 13 includes a dielectric layer between a pair of electrodes, which extend along the corresponding power supply line 42. The electric capacity of the retention capacitor 13 is determined in consideration of the frame frequency of a scanning signal, the leakage current of the driving TFT 12 during an off state, and the luminescence properties of the organic EL elements 20B, 20G, and 20R. In practice, after a proper electric capacity is determined, the area of the retention capacitor 13 is determined on the basis of the electric capacity.

The organic EL elements 20B, 20G, and 20R are disposed in regions defined by the scanning lines 31 and the data lines 41 and include pixel electrodes 23b, 23g, and 23r having substantially the same area, respectively. The first film-forming region 7a formed on the pixel electrode 23b has a larger area than the second film-forming region 7b or the third film-forming region 7c formed on the pixel electrode 23g or 23r, respectively. This reflects the luminance and emission lifetimes of the organic EL elements 20B, 20G, and 20R. At present, organic EL materials for emitting blue light have shorter emission lifetimes than organic EL materials for emitting green or red light. If the light-emitting layers in the film-forming regions for blue, green, and red have the same area and emit light at the same electric current, the emission lifetime for blue is shorter than those for green and red. The luminance depends on electric current and luminous area, that is, the size of a film-forming region. If the luminous area for blue is larger than the luminous area for green or red, the luminance for blue can be the same as the luminance for green or red at a lower electric current. Since the emission lifetime increases with decreasing electric current, the emission lifetime for blue can be the same as the emission lifetime for green or red. Thus, such a full-color display apparatus can have substantially the same emission lifetime for any luminescent color. In the present embodiment, in order to achieve the same emission lifetime for blue, green, and red, the luminous areas of the second organic EL element 20G and the third organic EL element 20R are approximately two thirds of the luminous area of the first organic EL element 20B.

Figure 4:
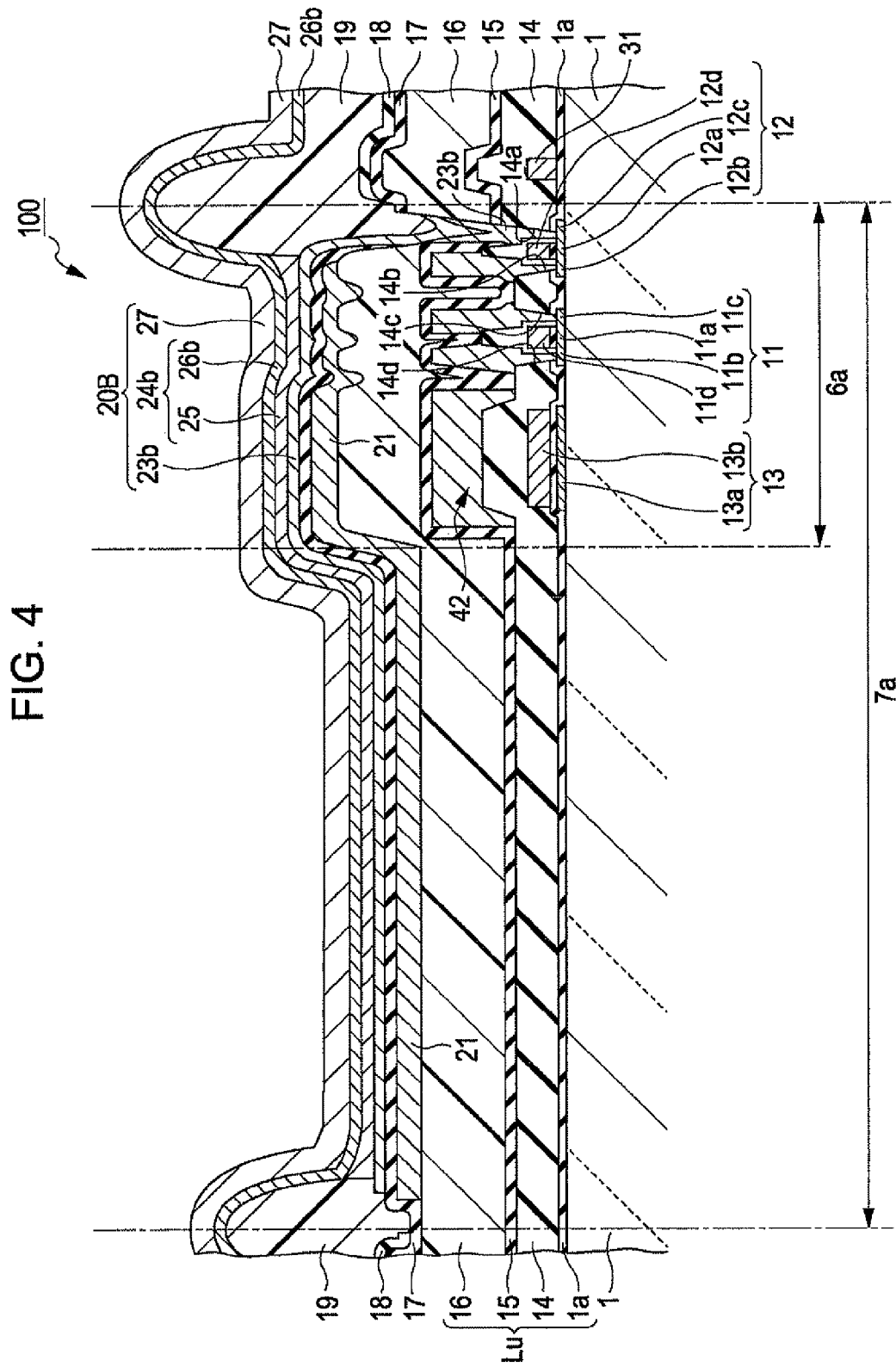
FIG. 4 is a schematic cross-sectional view taken along the line IV-IV in FIG. 3, illustrating an organic EL element for emitting blue light.
Figure 5:
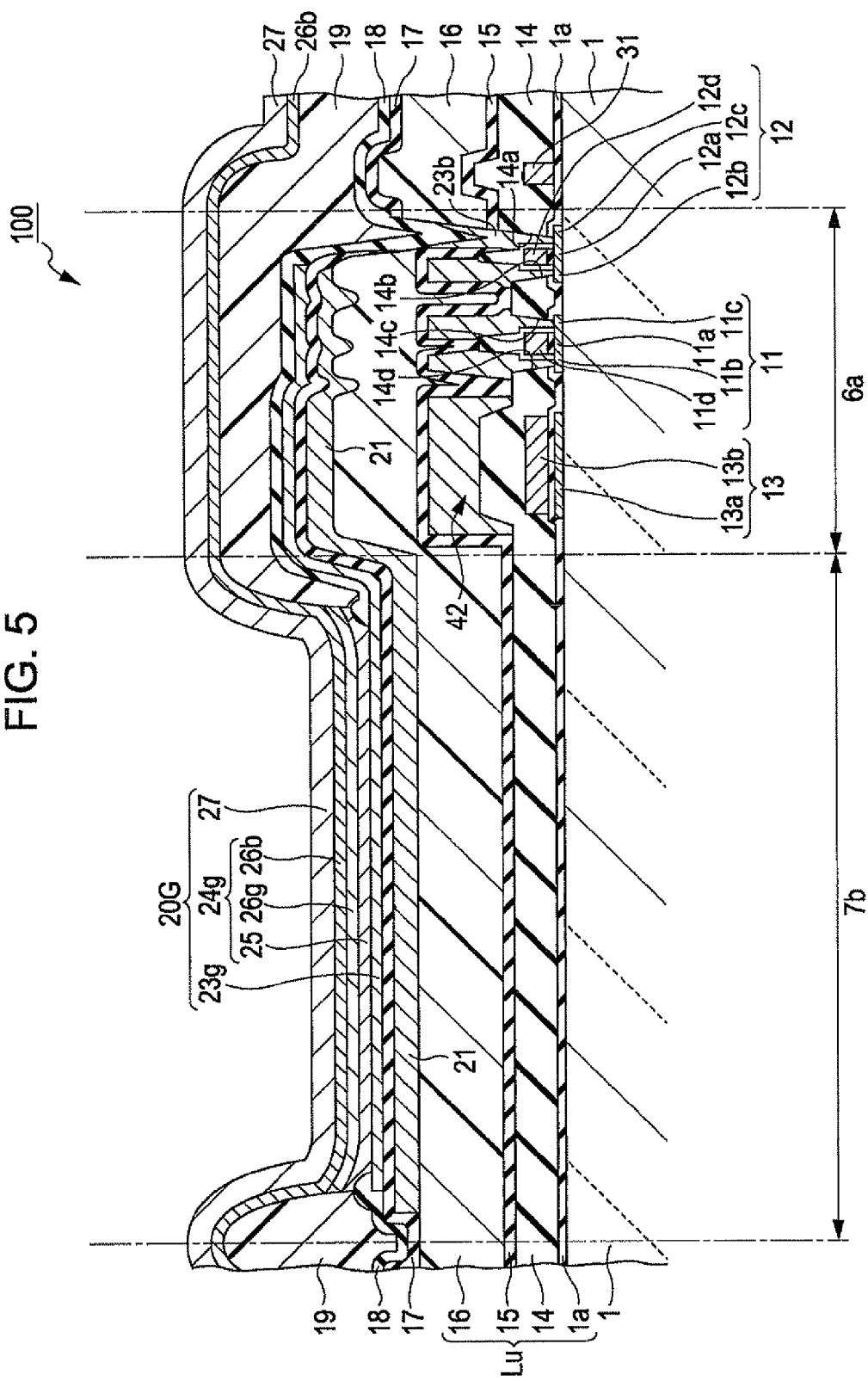
FIG. 5 is a schematic cross-sectional view taken along the line V-V in FIG. 3, illustrating an organic EL element for emitting green light.
Figure 6:
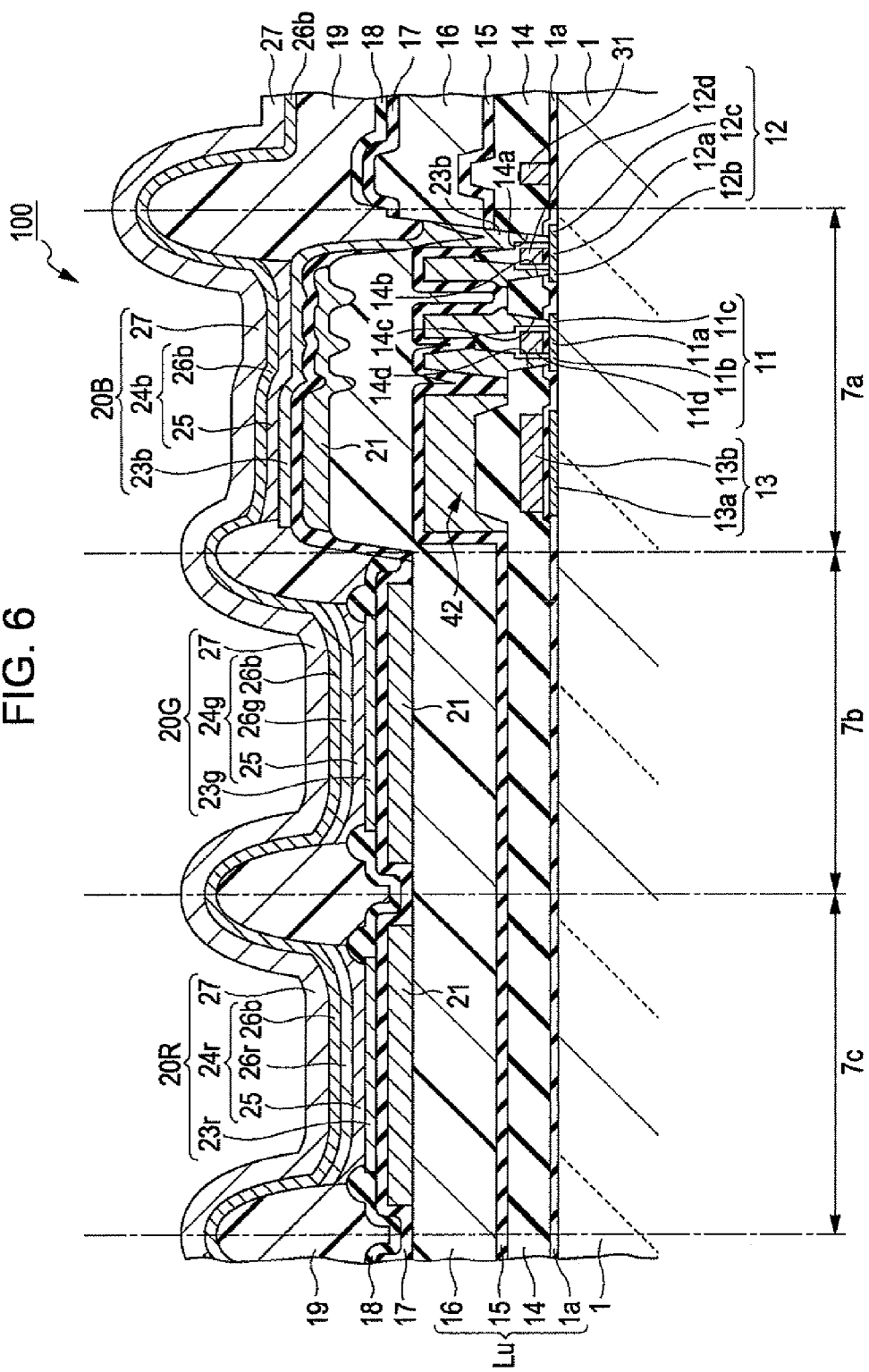
FIG. 6 is a schematic cross-sectional view taken along the line VI-VI in FIG. 3, illustrating three organic EL elements of different luminescent colors.

The structures of the organic EL elements 20B, 20G, and 20R will be described in detail below with reference to FIGS. 4, 5, and 6. FIG. 4 is a schematic cross-sectional view taken along the line IV-IV in FIG. 3, illustrating an organic EL element for emitting blue light. FIG. 5 is a schematic cross-sectional view taken along the line V-V in FIG. 3, illustrating an organic EL element for emitting green light. FIG. 6 is a schematic cross-sectional view taken along the line VI-VI in FIG. 3, illustrating three organic EL elements of different luminescent colors.

An organic EL device 100 according to the present embodiment is of a top-emission type. As illustrated in FIG. 4, for example, the first organic EL element 20B and the light-emission-control unit Lu are stacked on an element substrate 1. In other words, the first organic EL element 20B is disposed on the light-emission-control unit Lu disposed in an underlying layer.

The underlying layer includes the element substrate 1, the light-emission-control unit Lu, the reflective layer 21, and an insulating layer 17. In the top-emission structure, light emitted by the first organic EL element 20B is reflected by the reflective layer 21. The organic EL elements 20G and 20R also have the same structure.

The element substrate 1 may be formed of transparent glass or resin or opaque silicon. Semiconductor layers 11a, 12a, and 13a, for example, formed of polysilicon are formed on the element substrate 1. The semiconductor layer 11a constitutes the TFT 11. The semiconductor layer 12a constitutes the TFT 12. The semiconductor layer 13a constitutes the retention capacitor 13 and functions as an electrode (hereinafter also referred to as a first electrode 13a). Each of the semiconductor layers 11a, 12a, and 13a has a thickness of approximately 50 nm.

Except for the outer edges and gates of the semiconductor layers 11a and 12a and part of the semiconductor layer 13a, a gate-insulating layer 1a is disposed on the entire surface of the element substrate 1. Part of the gate-insulating layer 1a on the semiconductor layer 13a functions as a dielectric layer. The gate-insulating layer 1a has a thickness in the range of 50 to 100 nm.

A low-resistance metal wiring layer, for example, formed of aluminum (Al), tantalum (Ta), tungsten (W), or a metallic compound thereof is disposed on the gate-insulating layer 1a. The low-resistance metal wiring layer is patterned to form the scanning lines 31, the data lines 41 (not shown), and gate electrodes 11d and 12d of the TFTs 11 and 12. The low-resistance metal wiring layer is also patterned to form lines (not shown) to a second electrode 13b and the first electrode 13a of the retention capacitor 13. An interlayer insulating layer 14 is disposed on the gate-insulating layer 1a, the TFTs 11 and 12, the retention capacitor 13, and the scanning lines 31. The low-resistance metal wiring layer has a thickness in the range of approximately 500 to 600 nm. The interlayer insulating layer 14 also has a thickness in the range of approximately 500 to 600 nm.

The interlayer insulating layer 14 has contact holes 14a, 14b, 14c, and 14d for connection with sources 11b and 12b and drains 11c and 12c of the TFTs 11 and 12. The interlayer insulating layer 14 also has contact holes (not shown) for connection of the retention capacitor 13 with the power supply lines 42 and the TFT 12.

A low-resistance metal wiring layer, for example, formed of Al, Ta, W, or a metallic compound thereof is disposed on the interlayer insulating layer 14. The low-resistance metal wiring layer is patterned to form the power supply lines 42, lines between the contact holes 14b and 14c, and lines between the power supply lines 42 and the contact holes 14d. The low-resistance metal wiring layer has a thickness in the range of approximately 500 to 600 nm.

A protective layer 15 is disposed on the power supply lines 42 and the interlayer insulating layer 14. A planarization layer 16 is disposed on the protective layer 15. The gate-insulating layer 1a, the interlayer insulating layer 14, and the protective layer 15 may be formed of SiN, SiO, $SiO_2$, or an inorganic mixture of these silicon compounds. The protective layer 15 has a thickness in the range of approximately 200 to 300 nm. The planarization layer 16 may be formed of an acrylic or epoxy organic resin and has a thickness in the range of approximately 1 to 2 μm.

Even if the planarization layer 16 has a larger thickness than the low-resistance metal wiring layer or the interlayer insulating layer 14, the planarization layer 16 possibly has an uneven surface. In particular, because of the presence of the contact holes 14a, 14b, 14c, and 14d for connection with the TFTs 11 and 12 and lines, the surface of the first film-forming region 7a, which includes the TFTs 11 and 12 and the retention capacitor 13, has higher roughness than the second film-forming region 7b or the third film-forming region 7c.

The term "roughness", as used herein, can be defined by the arithmetical mean roughness (Ra) of the planarization layer 16, the standard deviation in height of the planarization layer 16 from the reference surface, or the standard deviation of luminance distribution in pixels during light emission.

The surface of the first film-forming region 7a has a difference in height (a difference between the maximum height and the minimum height) in the range of several tens to several hundreds of nanometers. In contrast, the cross-sectional view of FIG. 6 shows that the surfaces of the second film-forming region 7b and the third film-forming region 7c have little difference in height (a difference between the maximum height and the minimum height).

The first organic EL element 20B in the first film-forming region 7a includes the pixel electrode 23b, the functional layer 24b, and the common electrode 27 in this order on the underlying layer.

Use of a reflective material for the pixel electrode 23b can obviate the necessity of the reflective layer 21 and the insulating layer 17.

The reflective layer 21 may be formed of an Al—Nd reflective metallic material and has a thickness in the range of approximately 50 to 100 nm. The insulating layer 17 on the reflective layer 21 may be formed of a transparent inorganic material, such as SiN or SiO, and has a thickness in the range of approximately 50 to 100 nm.

The pixel electrode 23b is a transparent electroconductive film, for example, formed of indium tin oxide (ITO) or indium zinc oxide (IZO) and has a thickness in the range of approximately 50 to 100 nm. The pixel electrode 23b is connected to the drain 12c of the TFT 12 through the contact hole 14a.

The pixel electrode 23b is substantially defined by a second partition 19 surrounding the outer edge of the pixel electrode 23b. The second partition 19 is formed of a phenol or polyimide resin material and has a thickness (height) in the range of approximately 1 to 2 μm.

The functional layer 24b includes a hole-injection layer 25 and a first light-emitting layer 26b on the pixel electrode 23b. The hole-injection layer 25 is formed by a coating method (a liquid discharge method). The first light-emitting layer 26b is formed by a vapor deposition method, in which a functional material is evaporated to form a film.

The common electrode 27 is formed of a transparent electroconductive film, such as ITO or IZO, and covers the second partition 19 and the functional layer 24b. The common electrode 27 has a thickness in the range of approximately 50 to 100 nm.

As illustrated in FIG. 5, the second organic EL element 20G adjacent to the first organic EL element 20B includes the pixel electrode 23g, a functional layer 24g, and the common electrode 27. Although these layers are disposed on the underlying layer as in the first organic EL element 20B, the functional layer 24g is disposed in the second film-forming region 7b. The second film-forming region 7b is defined by an insulating layer 18 serving as a first partition and the second partition 19 disposed on the insulating layer 18. The insulating layer 18 covers the TFTs 11 and 12 and the retention capacitor 13. The insulating layer 18 is formed of an inorganic insulating material, such as $SiO_2$, and has a thickness in the range of approximately 50 to 100 nm.

The functional layer 24g includes a hole-injection layer 25, a second light-emitting layer 26g, and the first light-emitting layer 26b.

The third organic EL element 20R adjacent to the second organic EL element 20G has the same cross-sectional structure as the second organic EL element 20G. More specifically, a functional layer 24r is disposed in the third film-forming region 7c, which is defined by the insulating layer 18 and the second partition 19 disposed on the insulating layer 18. The insulating layer 18 covers the TFTs 11 and 12 and the retention capacitor 13.

The functional layer 24r includes a hole-injection layer 25, a third light-emitting layer 26r, and the first light-emitting layer 26b.

The second film-forming region 7b and the third film-forming region 7c do not include part (the area 6a) of the underlying layer in which the TFTs 11 and 12 and the retention capacitor 13 are disposed. Thus, the pixel electrode 23g and the pixel electrode 23r in the second film-forming region 7b and the third film-forming region 7c have a flatter surface than in the first film-forming region 7a.

In the present embodiment, the hole-injection layers 25, the second light-emitting layer 26g, and the third light-emitting layer 26r are formed by a coating method (a liquid discharge method), in which a liquid containing a functional material is applied to the second film-forming region 7b or the third film-forming region 7c and is dried to form a film.

Since the second film-forming region 7b and the third film-forming region 7c are flatter than the first film-forming region 7a, the second light-emitting layer 26g and the third light-emitting layer 26r can have an almost constant thickness (cross-sectional shape) by a coating method (a liquid discharge method).

As illustrated in FIG. 6, the first light-emitting layer 26b is disposed across the first film-forming region 7a, the second film-forming region 7b (the second light-emitting layer 26g), the third film-forming region 7c (the third light-emitting layer 26r), and the second partition 19. Since the first light-emitting layer 26b is formed by a vapor deposition method, which can sufficiently cover an uneven surface, the first light-emitting layer 26b can have an almost constant thickness. The common electrode 27 is disposed on the first light-emitting layer 26b. A method for forming the hole-injection layer 25 and the light-emitting layers 26b, 26g, and 26r will be described in detail below in the description of a method for manufacturing the organic EL device 100.

In order to prevent the intrusion of moisture and gases, such as oxygen, into the functional layers 24b, 24g, and 24r, the element substrate 1 on which the light-emission-control units Lus and the organic EL elements 20B, 20G, and 20R are disposed is joined to a sealing substrate (not shown), for example, formed of transparent glass.

The organic EL device 100 is a full-color display apparatus having a top-emission structure, in which light from the functional layers 24b, 24g, and 24r is reflected by the reflective layers 21 and is emitted from the sealing substrate. Since the light-emission-control units Lus are disposed under the reflective layers 21, the TFTs 11 and 12, the retention capacitor 13, and their lines (such as the scanning lines 31, the data lines 41, and the power supply lines 42) of the drive circuit unit do not interfere with light emission from the functional layers 24b, 24g, and 24r. These components of the drive circuit unit can therefore be freely arranged on the element substrate 1. The organic EL elements 20B, 20G, and 20R may have another structure. For example, an optical resonant structure may be disposed between each of the functional layers 24b, 24g, and 24r and the reflective layer 21 to improve the luminance of their respective luminescent colors.

Method for Manufacturing Organic EL Device

A method for manufacturing the organic EL device 100 according to the present embodiment will be described below with reference to FIGS. 7 to 10. FIG. 7 is a flow chart of a method for manufacturing an organic EL device according to the first embodiment. FIGS. 8A to 8C are schematic plan views illustrating a method for manufacturing an organic EL device. FIGS. 9D to 9F and FIGS. 10G to 10I are schematic cross-sectional views illustrating a method for manufacturing an organic EL device.

As illustrated in FIG. 7, a method for manufacturing an organic EL device 100 according to the present embodiment includes forming a drive circuit unit on an element substrate 1 (step S1), dividing a surface of an underlying layer into a first film-forming region 7a, a second film-forming region 7b, and a third film-forming region 7c corresponding to three adjacent light-emission-control units Lus and forming a reflective layer 21 for each of the film-forming regions 7a, 7b, and 7c (step S2), forming pixel electrodes 23b, 23g, and 23r to be electrically connected to the light-emission-control units Lus (step S3), forming a second partition 19 defining the first film-forming region 7a, the second film-forming region 7b, and the third film-forming region 7c (step S4), forming a hole-injection layer 25 on each of the pixel electrodes 23b, 23g, and 23r (step S5), forming light-emitting layers 26b, 26g, and 26r (step S6), forming a common electrode 27 (step S7), and joining the element substrate 1 to a sealing substrate (step S8).

As illustrated in FIG. 8A, in the step S1 of forming a drive circuit unit, a polysilicon film is formed on an element substrate 1, and semiconductor layers 11a, 12a, and 13a are formed by photolithography. The semiconductor layers 11a, 12a, and 13a have a thickness of approximately 50 nm. The polysilicon film can be formed by a known technique, such as low-pressure CVD.

A gate-insulating layer 1a is then formed on the element substrate 1 while the source and drain sides of the semiconductor layers 11a and 12a, which correspond to TFTs 11 and 12, and an electrical connector of the semiconductor layer 13a are masked. For example, a gate-insulating layer 1a having a thickness of approximately 50 to 100 nm can be formed by sputtering using a SiN or SiO target in a vacuum.

A low-resistance Al film having a thickness in the range of approximately 500 to 600 nm can be formed on the gate-insulating layer 1a by sputtering. As illustrated in FIG. 8B, the low-resistance Al film is patterned by photolithography to form scanning lines 31, data lines 41, lines 31a serving as gate electrodes 11d extending from the scanning lines 31 to the semiconductor layers 11a, lines 13c (including gate electrodes 12d) extending from the semiconductor layers 12a to connectors of the semiconductor layers 13a, and second electrodes 13b of retention capacitors 13. The scanning lines 31 perpendicular to the data lines 41 are interrupted by the data lines 41.

An interlayer insulating layer 14 is then formed on substantially the entire surface of the element substrate 1. An interlayer insulating layer 14 having a thickness in the range of approximately 500 to 600 nm can be formed by sputtering using a SiN or SiO target in a vacuum. In the sputtering, portions in which lines other than power supply lines 42 are to be formed are masked, for example, with a photosensitive resin material. After the interlayer insulating layer 14 is formed, the masked portions are removed to provide contact holes 14a, 14b, 14c, 14d, 14e, 14f, 14g, and 14h, as illustrated in FIG. 8C.

A low-resistance Al film having a thickness in the range of approximately 500 to 600 nm is then formed on the interlayer insulating layer 14 by sputtering. The low-resistance Al film is patterned by photolithography to form power supply lines 42 and various lines, as illustrated in FIG. 8C. For example, the contact holes 14d and the contact holes 14f can be filled with a low-resistance metal to form lines 11e connecting the data lines 41 with the sources of the TFTs 11. The contact holes 14c and the contact holes 14e can be filled with a low-resistance metal to form lines 11f connecting the drains of the TFTs 11 with the gates of the TFTs 12. Two contact holes 14g on opposite sides of a data line 41 are filled with a low-resistance metal to form a line 31c electrically connecting the corresponding scanning lines 31 across the data line 41. The contact holes 14b and the contact holes 14h are filled with a low-resistance metal to connect the power supply lines 42 with the sources of the TFTs 12 and the second electrodes 13b of the retention capacitors 13.

A protective layer 15 is then formed on the drive circuit units. For example, a protective layer 15 having a thickness in the range of 200 to 300 nm is formed by sputtering using a SiN target. A planarization layer 16 is then formed on the protective layer 15. The planarization layer 16 can be formed by applying a photosensitive acrylic resin at a thickness in the range of approximately 1 to 2 μm by spin coating or roll coating, solidifying the acrylic resin, and patterning the acrylic resin by photolithography. Patterned portions principally include contact holes 16a in communication with the contact holes 14a connecting the pixel electrodes 23b, 23g, and 23r with the drains of the TFTs 12. Alternatively, a material for the planarization layer may be coated after the contact holes 16a are masked.

In the step S2 of forming a reflective layer, as illustrated in FIG. 9D, a reflective layer 21 is formed in a first film-forming region 7a, a second film-forming region 7b, and a third film-forming region 7c on the planarization layer 16. These film-forming regions are defined by a difference in height. For example, reflective layers 21 having a thickness in the range of approximately 50 to 100 nm are formed by sputtering of the above-mentioned material for a reflective layer, Al—Nd, followed by photolithography. The reflective layers 21 thus formed have slightly larger areas than the pixel electrodes 23b, 23g, and 23r. An insulating layer 17 is then formed on the reflective layers 21. For example, an insulating layer 17 having a thickness of approximately 50 to 100 nm can be formed by sputtering using a SiN or SiO target in a vacuum.

In the step S3 of forming a pixel electrode, as illustrated in FIG. 9D, an ITO film having a thickness of approximately 100 nm can be formed on the insulating layer 17 by sputtering. The ITO film is then patterned by photolithography to form pixel electrodes 23b, 23g, and 23r on top of the reflective layers 21. The contact holes 16a are filled with ITO to connect the pixel electrodes 23b, 23g, and 23r with the TFTs 12 (drains). The pixel electrodes 23b, 23g, and 23r have substantially the same area.

Insulating layers 18 are then formed on the outer edges of the pixel electrodes 23g and 23r. For example, insulating layers 18 having a thickness in the range of 50 to 100 nm are formed by sputtering using a SiN or SiO target while portions other than the outer edges of the pixel electrodes 23g and 23r are masked.

In the step S4 of forming a partition, a phenol or polyimide photosensitive resin material is applied to the element substrate 1 at a thickness in the range of 1 to 2 μm, is solidified, is exposed to light, and is developed to form a second partition 19 on the insulating layer 18. As illustrated in FIG. 9D, the second partition 19 substantially defines the first film-forming region 7a, the second film-forming region 7b, and the third film-forming region 7c. With emission lifetime taken into account, the second partition 19 is formed such that the first film-forming region 7a has a larger area than the second film-forming region 7b and the third film-forming region 7c. In other words, the second partition 19 is formed such that the second film-forming region 7b and the third film-forming region 7c have a smaller area than the first film-forming region 7a.

In the step S5 of forming a hole-injection layer, as illustrated in FIG. 9D, droplets of a predetermined amount of liquid 60 containing a material for the hole-injection layer are applied to the first film-forming region 7a, the second film-forming region 7b, and the third film-forming region 7c with an ejection head (ink jet head) 50 for discharging liquid from a nozzle. For example, the liquid 60 contains diethylene glycol and water (pure water) as solvents and 0.5% by weight of a mixture (PEDOT/PSS) of a polythiophene derivative, such as polyethylenedioxythiophene (PEDOT), and a dopant polystyrene sulfonate) (PSS) as the material for the hole-injection layer. The proportion of the solvent is adjusted such that the liquid 60 has a viscosity of approximately 20 mPa·s or less.

Examples of the material for a hole-injection layer other than PEDOT/PSS include polystyrene, polypyrrole, polyaniline, polyacetylene, and derivatives thereof.

The liquid 60 on the element substrate 1 is heat-dried, for example, by lamp annealing to evaporate the solvents, forming a hole-injection layer 25 in each of the first film-forming region 7a, the second film-forming region 7b, and the third film-forming region 7c, as illustrated in FIG. 9E. Before the liquid 60 is applied, the surfaces of the pixel electrodes 23b, 23g, and 23r and exposed portions of the insulating layer 18 on the outer edges of the pixel electrodes 23g and 23r may be subjected to lyophilic treatment, and the surface of the second partition 19 may be subjected to liquid-repellent treatment. The lyophilic treatment may be plasma processing using oxygen as a processing gas. The liquid-repellent treatment may be plasma processing using a fluorine gas as a processing gas. Such treatments allow the droplets of the liquid 60 to spread evenly over the pixel electrodes 23b, 23g, and 23r.

In the step S6 of forming a light-emitting layer, as illustrated in FIG. 9F, droplets of a liquid 70G containing a material for a green-light-emitting layer and a liquid 70R containing a material for a red-light-emitting layer are applied to the second film-forming region 7b and the third film-forming region 7c, respectively, with different ejection heads 50 (an ejection head 50G and an ejection head 50R, respectively).

For example, the liquids 70G and 70R contain cyclohexylbenzene as a solvent and 0.7% by weight of polyfluorene (PF) derivatives for emitting green and red light, respectively, as the material for a light-emitting layer. The liquids 70G and 70R have a viscosity of approximately 14 mPa·s. Examples of the material for a light-emitting layer other than PF derivatives include poly(para-phenylene vinylene) (PPV) derivatives, polyphenylene (PP) derivatives, poly(para-phenylene) (PPP) derivatives, polyvinylcarbazole (PVK), polythiophenylene derivatives, such as PEDOT, and polymethylphenylsilane (PMPS). These polymeric materials may be doped with a low-molecular-weight material, such as a perylene dye, a coumarin dye, a rhodamine dye, rubrene, nile red, coumarin 6, or quinacridone.

Figure 10G:
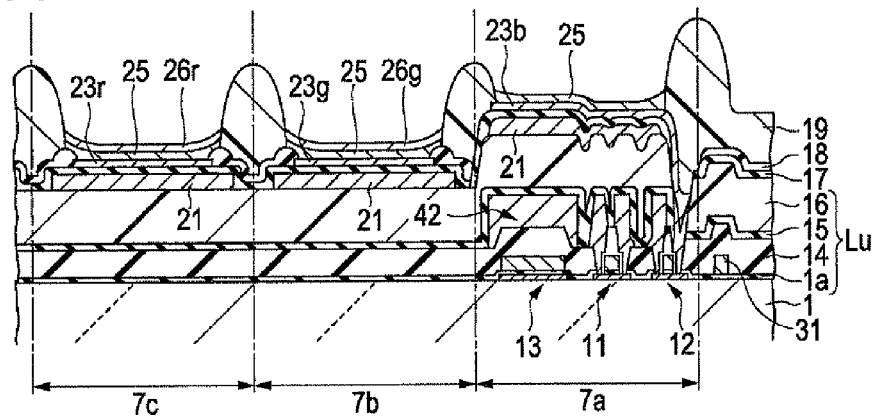
FIGS. 10G to 10I are schematic cross-sectional views illustrating a method for manufacturing an organic EL device.

The liquids 70G and 70R are dried (solidified) by vacuum drying, which can more uniformly evaporate the solvent component than general heat drying. This allows light-emitting layers 26g and 26r to be formed on the hole-injection layer 25, as illustrated in FIG. 10G. The surfaces of the underlying layer on which the pixel electrodes 23g and 23r are formed in the second film-forming region 7b and the third film-forming region 7c have lower roughness than in the first film-forming region 7a. Thus, the liquids 70G and 70R discharged from the ejection heads 50G and 50R spread evenly over the second film-forming region 7b and the third film-forming region 7c, forming light-emitting layers 26g and 26r each having a thickness of approximately 80 nm after drying.

Figure 10H:
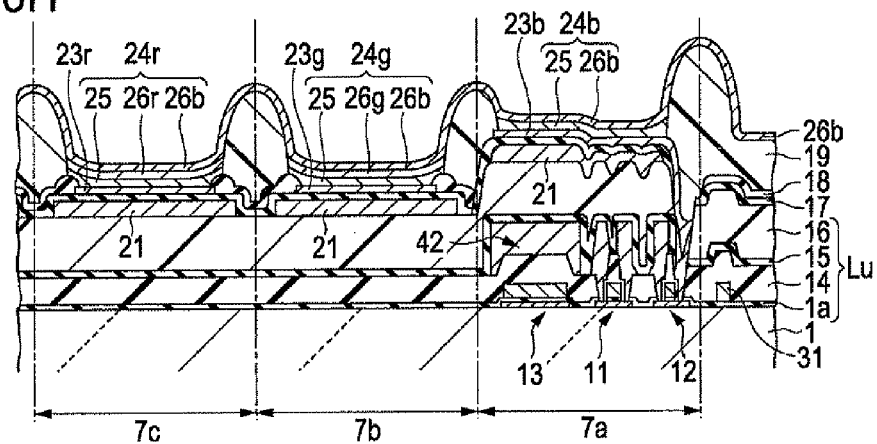

As illustrated in FIG. 10H, a first light-emitting layer 26b is formed on the hole-injection layer 25 in the first film-forming region 7a by a vapor deposition method. At the same time, the first light-emitting layer 26b is formed in the second film-forming region 7b and the third film-forming region 7c. Thus, the first light-emitting layer 26b is also formed on the second light-emitting layer 26g and the third light-emitting layer 26r. The first light-emitting layer 26b therefore preferably has electron-transport characteristics as well as hole-transport characteristics.

The first light-emitting layer 26b can be formed by co-evaporation of a quinolinol-aluminum complex (Alq3), which can emit blue light, and diphenylnaphthyldiamine (αNPD) having hole-transport characteristics and subsequent vapor deposition of 4,4'-bis(2,2'-diphenylethene-1-yl)biphenyl (DPBVi) having hole-blocking ability. The first light-emitting layer 26b has a thickness of approximately 50 nm. The vapor deposition of αNPD may be followed by vapor deposition of Alq3. This ensures the hole-transport characteristics of at least the first light-emitting layer 26b, improving the luminous efficiency of blue light.

Although the surface of the underlying layer in the first film-forming region 7a has a difference in height in the range of several tens to several hundreds of nanometers, the first light-emitting layer 26b formed on the hole-injection layer 25 by a vapor deposition method has small variations in thickness.

Through these steps, there are provided the functional layer 24b including the hole-injection layer 25 and the first light-emitting layer 26b, the functional layer 24g including the hole-injection layer 25, the second light-emitting layer 26g, and the first light-emitting layer 26b, and the functional layer 24r including the hole-injection layer 25, the third light-emitting layer 26r, and the first light-emitting layer 26b.

Figure 10I:
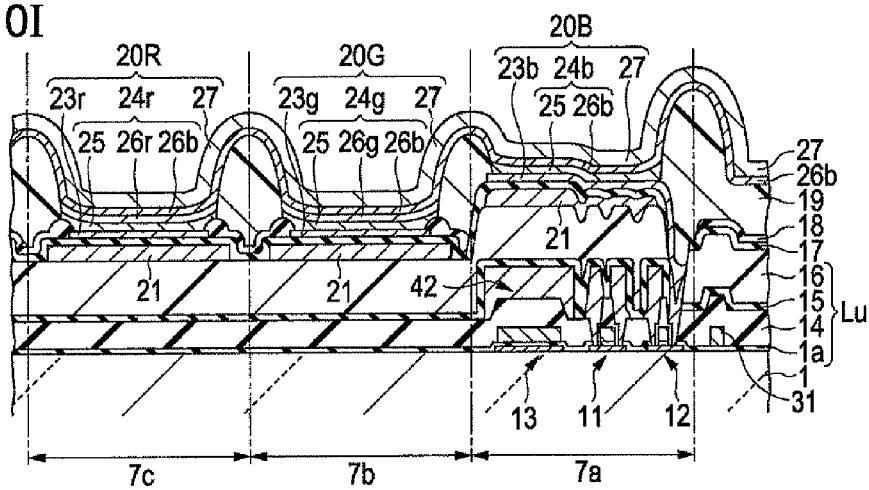

In the step S7 of forming a common electrode, as illustrated in FIG. 10I, a common electrode 27 is formed on the first light-emitting layer 26b in the first film-forming region 7a to the third film-forming region 7c. This completes the organic EL elements 20B, 20G, and 20R.

The material for the common electrode 27 is preferably a combination of an ITO or MgAg compound and a metal, such as Ca, Ba, or Al, or a fluoride, such as LiF. The material is formed into a transparent film. More preferably, a Ca, Ba, or LiF film having a small work function is disposed near to the functional layers 24b, 24g, and 24r, and an ITO film having a large work function is disposed far from the functional layers 24b, 24g, and 24r. In the present embodiment, the common electrode 27 is formed of LiF/MgAg. The common electrode 27 may be overlaid with a $SiO_2$ or SiN protective layer. The protective layer can prevent oxidation of the common electrode 27. The common electrode 27 can be formed by vapor deposition, sputtering, or CVD. In particular, vapor deposition is preferred to prevent thermal damage to the functional layers 24*b*, 24*g*, and 24*r*.

In the step S8 of the sealing process, the element substrate 1 including the light-emission-control units Lus and the organic EL elements 20 is joined to a sealing substrate, completing the organic EL device 100. The element substrate 1 can be joined to the sealing substrate by can sealing, in which an adhesive is applied around the organic EL elements 20 while leaving a space between the element substrate 1 and the sealing substrate, or by filling the space with a transparent resin.

The method for manufacturing the organic EL device 100 by a coating method (a liquid discharge method) and a vapor deposition method can efficiently produce the light-emitting layers 26*b*, 26*g*, and 26*r* having small variations in thickness without using a deposition mask in the first film-forming region 7*a*, the second film-forming region 7*b*, and the third film-forming region 7*c*, as compared with selective formation of the light-emitting layers 26*b*, 26*g*, and 26*r* by a vapor deposition method alone. Thus, a full-color organic EL device 100 of a top-emission type can be efficiently manufactured. The organic EL device 100 has excellent luminance balance of different luminescent colors and reduced variations in luminance.

The functional layers 24*b*, 24*g*, and 24*r* may have another structure. For example, an intermediate layer may be provided between the hole-injection layer 25 and the light-emitting layers 26*g* and 26*r*. For example, a liquid containing a material for the intermediate layer contains cyclohexylbenzene as a solvent and approximately 0.1% by weight of a triphenylamine polymer (TFP) as the material for the intermediate layer.

The intermediate layer can improve the hole-transport characteristics (injectability) to the light-emitting layers 26*g* and 26*r* and prevent the intrusion of electrons from the light-emitting layers 26*g* and 26*r* to the hole-injection layer 25.

The first light-emitting layer 26*b* is not limited to a layer having hole-transport characteristics and electron-transport characteristics. For example, an electron-transport layer, such as an Alq3 layer, may be formed between a blue-light-emitting layer 26*b* and a LiF layer, or a hole-blocking layer, such as a bis-(2-methyl-8-quinolinolate)-4-(phenylphenolate)aluminum (BAlq)layer, may be formed between an electron-transport layer and the first light-emitting layer 26*b*.

The intermediate layer, the electron-transport layer, and the hole-blocking layer improve the efficiency of excitation emission due to coupling of positive holes and electrons in the light-emitting layers 26*b*, 26*g*, and 26*r*.

The first light-emitting layer 26*b* may be formed by spin coating or dipping. Also in this case, even when the surface of the underlying layer has a difference in height in the range of several tens to several hundreds of nanometers, the first light-emitting layer 26*b* can have small variations in thickness. Thus, the light-emitting layers 26*b*, 26*g*, and 26*r* can be formed by an appropriate method in consideration of the roughness of the underlying layer in the film-forming regions 7*a*, 7*b*, and 7*c*.

In the present embodiment, the areas of the first film-forming region 7*a*, the second film-forming region 7*b*, and the third film-forming region 7*c*, that is, the substantial luminous areas of the organic EL elements 20B, 20G, and 20R are determined in consideration of the emission lifetime of each luminescent color.

At present, a light-emitting layer formed by a coating method (a liquid discharge method) mainly with a polymeric material tends to have a shorter emission lifetime than a light-emitting layer formed by a vapor deposition method with a low-molecular material. A light-emitting layer having a longer emission peak wavelength tends to have a longer emission lifetime.

Meanwhile, the emission lifetime depends on the electric current passing through a light-emitting layer, and the luminance depends on the electric current and the luminous area. Considering that the first film-forming region 7*a* includes a portion of the underlying layer having the highest roughness, in order to balance the emission lifetimes of luminescent colors at stable luminance, the first light-emitting layer 26*b* having a desired thickness is formed by a vapor deposition method, which can sufficiently cover an uneven surface. This can prevent concentration of electric currents caused by variations in thickness, thereby preventing variations in luminance and reduction in emission lifetime. In addition, a light-emitting layer formed by a vapor deposition method is preferably the blue-light-emitting layer 26*b*, which has the shortest emission peak wavelength of three luminescent colors blue (B), green (G), and red (R).

In the comparison of the second light-emitting layer 26*g* (green) and the third light-emitting layer 26*r* (red) each formed by coating, the second light-emitting layer 26*g* (green) may have a shorter emission lifetime. Thus, the third film-forming region 7*c* in which the third light-emitting layer 26*r* is to be formed preferably has a smaller area than the second film-forming region 7*b* in which the second light-emitting layer 26*g* is to be formed. In other words, a light-emitting layer having a shorter emission lifetime is preferably formed in a film-forming region having a larger area. Reduction in electric current passing through a light-emitting layer having a shorter emission lifetime can reduce a difference in emission lifetime of luminescent colors.

To summarize, the first embodiment has the following advantages.

1) The blue-light-emitting layer 26*b* having the shortest emission peak wavelength is formed by a vapor deposition method in the first film-forming region 7*a*, which includes a drive circuit unit in an underlying layer having higher roughness. Thus, the blue-light-emitting layer 26*b* can have an almost constant thickness irrespective of the roughness of the underlying layer.

2) In the second film-forming region 7*b* and the third film-forming region 7*c*, which exclude the drive circuit unit so as to be flatter than the first film-forming region 7*a*, the light-emitting layers 26*g* and 26*r* having a longer emission peak wavelength than the first light-emitting layer 26*b* are formed by a coating method (a liquid discharge method). The flatter underlying layer allows the green-light-emitting layer 26*g* and the red-light-emitting layer 26*r* to have an almost constant thickness (cross-sectional shape).

3) The areas of the first film-forming region 7*a*, the second film-forming region 7*b*, and the third film-forming region 7*c*, that is, the luminous areas of the organic EL elements 20B, 20G, and 20R are determined so as to satisfy the relationship of the area of the blue-light-emitting layer 26*b*>the area of the green-light-emitting layer 26*g*≧the area of the red-light-emitting layer 26*r*. With the luminance and emission lifetime of light-emitting layers 26*b*, 26*g*, and 26*r* taken into account, the luminescent colors are well balanced.

4) The first film-forming region 7*a* is defined by the second partition 19 alone so that the area of the first film-forming region 7*a* including the blue-light-emitting layer 26*b* formed by a vapor deposition method is greater than the areas of the second film-forming region 7*b* and the third film-forming region 7*c*. Thus, a desired area can be obtained relatively easily without the necessity of defining the first film-forming region 7a with the insulating layer 18.

Second Embodiment

Organic EL Device

Figure 11:
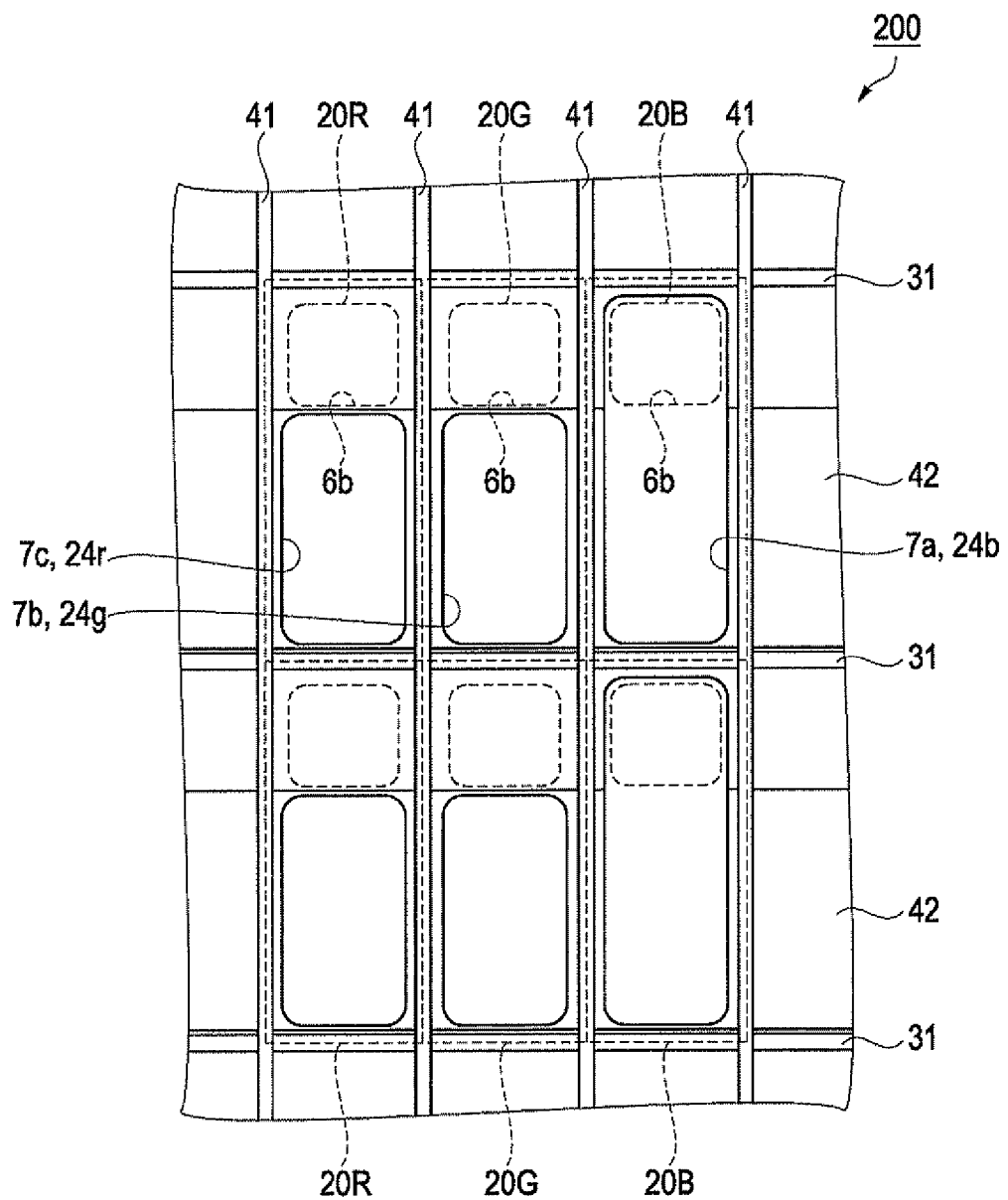
FIG. 11 is a schematic plan view of the arrangement of organic EL elements in an organic EL device according to a second embodiment.
Figure 12:
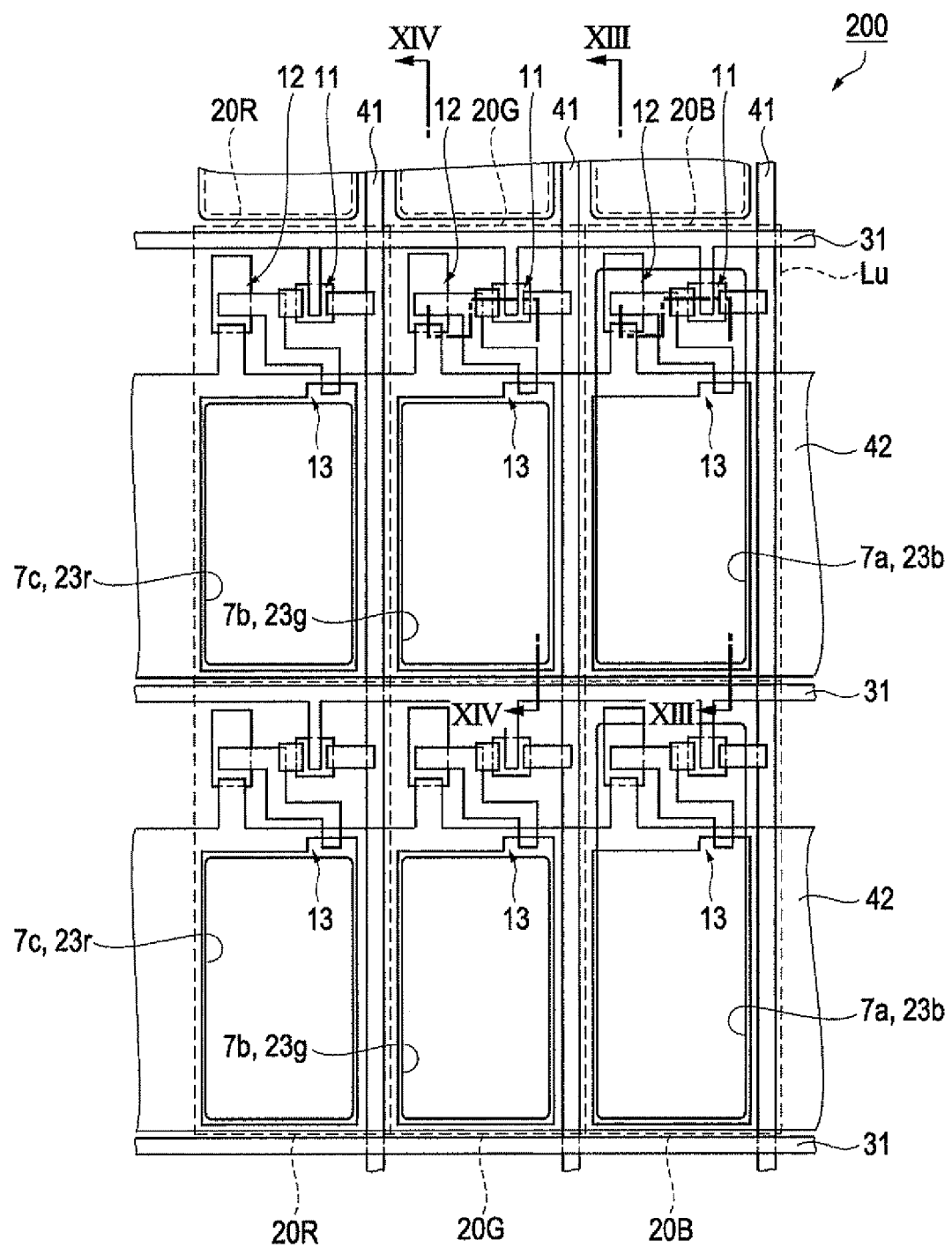
FIG. 12 is a schematic plan view of a drive circuit unit in the organic EL device according to the second embodiment.
Figure 13:
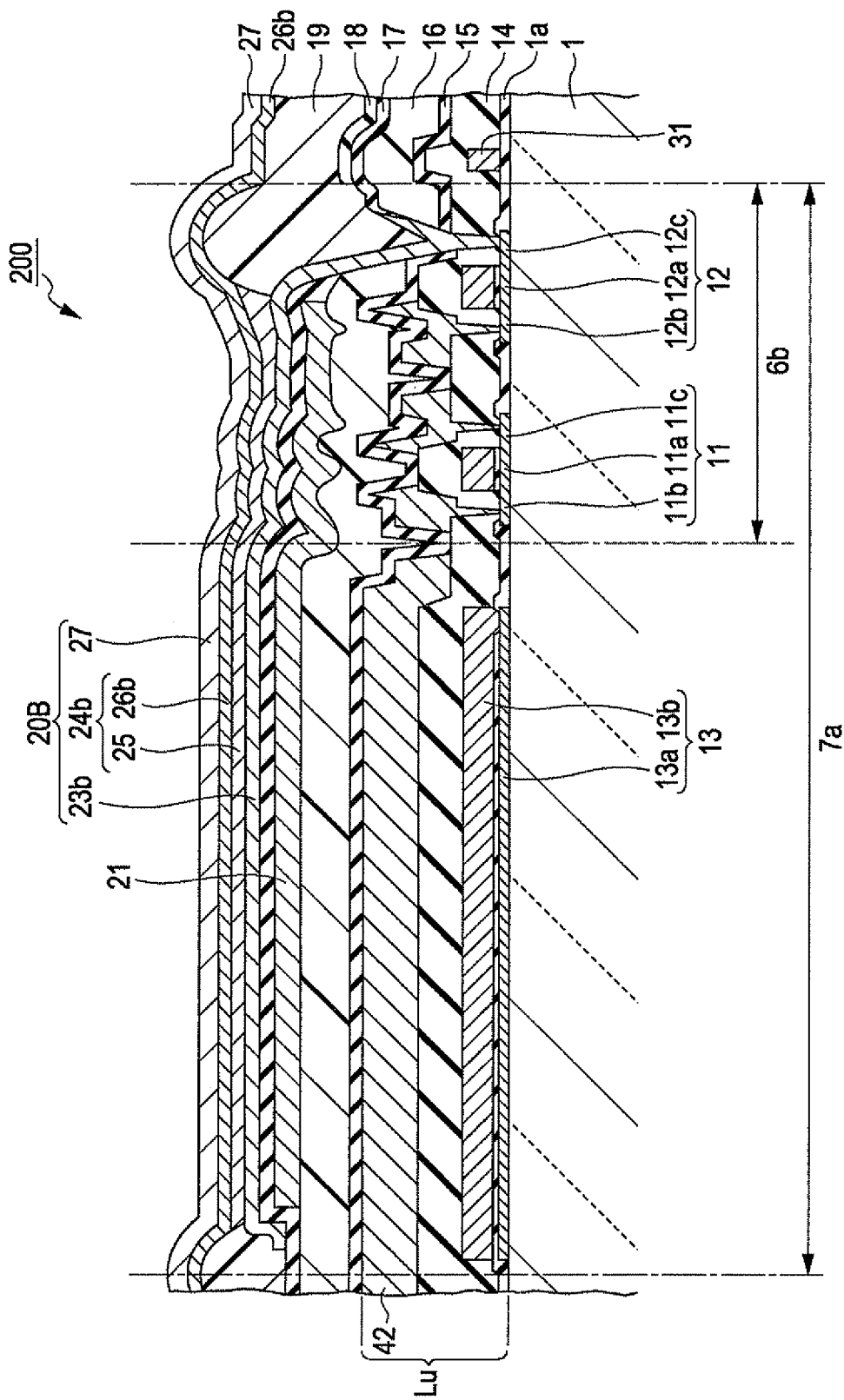
FIG. 13 is a schematic cross-sectional view of an organic EL element taken along the line XIII-XIII in FIG. 12.
Figure 14:
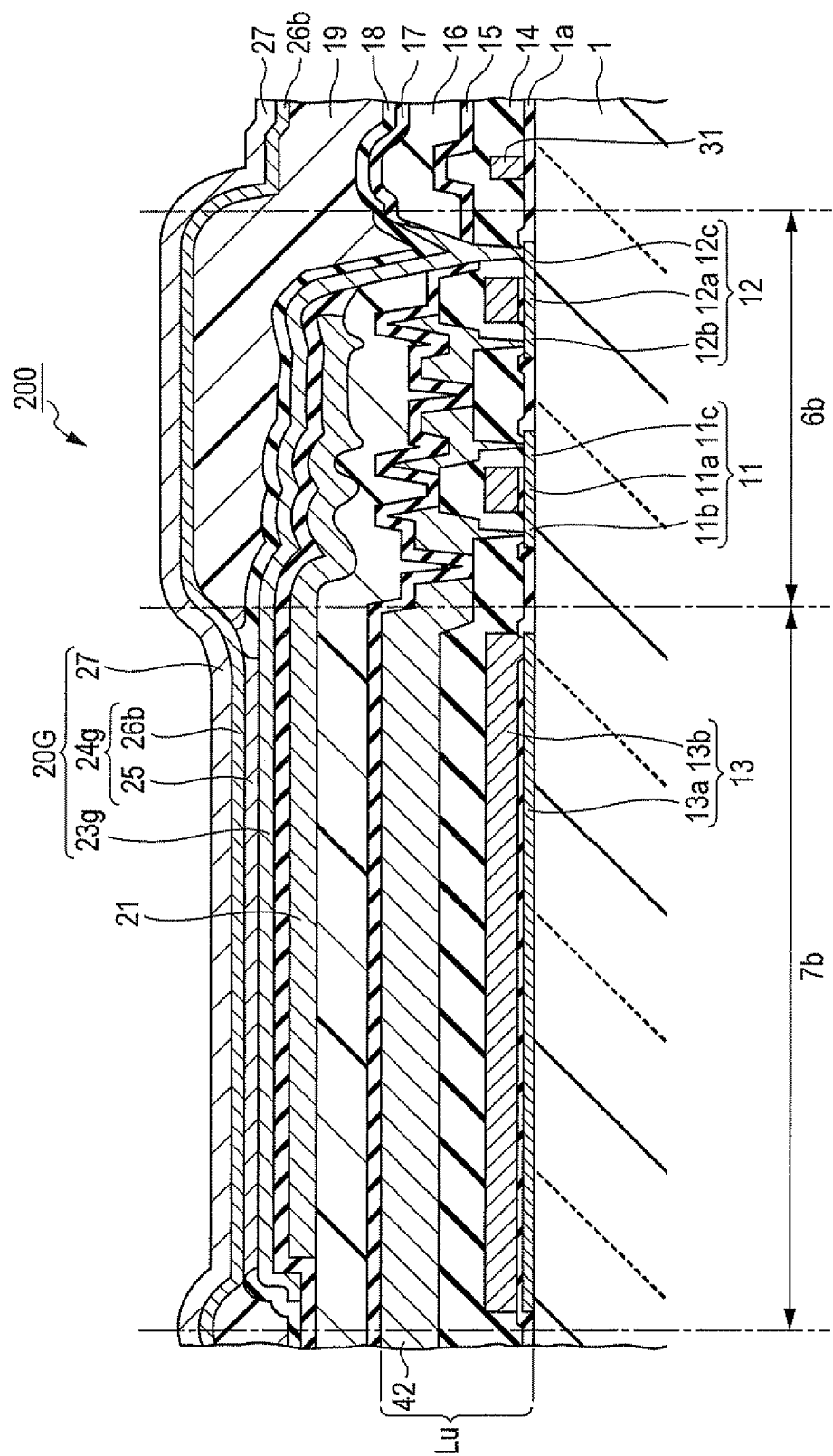
FIG. 14 is a schematic cross-sectional view of an organic EL element taken along the line XIV-XIV in FIG. 12.

An organic EL device according to a second embodiment will be described below with reference to FIGS. 11 to 14. FIG. 11 is a schematic plan view of the arrangement of organic EL elements in an organic EL device according to the second embodiment. FIG. 12 is a schematic plan view of a drive circuit unit in the organic EL device. FIG. 13 is a schematic cross-sectional view of an organic EL element taken along the line XIII-XIII in FIG. 12. FIG. 14 is a schematic cross-sectional view of an organic EL element taken along the line XIV-XIV in FIG. 12.

An organic EL device according to the present embodiment is the same as the organic EL device 100 according to the first embodiment except that the retention capacitor 13 and the power supply lines 42 in the drive circuit unit are differently arranged. The same components as in the first embodiment are denoted by the same reference numerals and will not be further described.

More specifically, as illustrated in FIG. 11, an organic EL device 200 according to the present embodiment includes organic EL elements 20B, 20G, and 20R for emitting blue, green, and red light. The organic EL elements 20B, 20G, and 20R are disposed in regions defined by scanning lines 31 and data lines 41, which cross each other.

A functional layer 24b of the first organic EL element 20B for emitting blue light is disposed in a first film-forming region 7a defined by the corresponding scanning lines 31 and data lines 41. The first film-forming region 7a includes a region 6b of the underlying layer in which part of a drive circuit unit for driving the first organic EL element 20B is disposed. An adjacent functional layer 24g of the second organic EL element 20G for emitting green light is disposed in a second film-forming region 7b. The second film-forming region 7b does not include a region 6b of the underlying layer in which part of a drive circuit unit for driving the second organic EL element 20G is disposed. A functional layer 24r of the third organic EL element 20R for emitting red light is disposed in a third film-forming region 7c. The third film-forming region 7c does not include a region 6b of the underlying layer in which part of a drive circuit unit for driving the third organic EL element 20R is disposed.

The areas of the second film-forming region 7b and the third film-forming region 7c are approximately two thirds of the area of the first film-forming region 7a. As in the first embodiment, this considers the emission lifetimes of the organic EL elements 20B, 20G, and 20R of different luminescent colors.

The areas of the first film-forming region 7a, the second film-forming region 7b, and the third film-forming region 7c correspond to their luminous areas. With an increase in luminous area, driving currents for emitting light from the functional layers 24b, 24g, and 24r must be stably supplied to the organic EL elements 20B, 20G, and 20R. The electrical resistance of the power supply lines 42 must therefore be maintained to prevent loss in driving current.

In the present embodiment, the power supply lines 42 extend along the scanning lines 31 and overlap with the second film-forming region 7b and the third film-forming region 7c. Thus, the power supply lines 42 are wider along the data lines 41 than the power supply lines 42 in the first embodiment.

As illustrated in FIG. 12, the retention capacitor 13 of the drive circuit unit overlaps with the corresponding wide power supply line 42 and has a size almost equivalent to the area of the second film-forming region 7b or the third film-forming region 7c.

As illustrated in FIG. 13, a second electrode 13b of a pair of electrodes 13a and 13b of the retention capacitor 13 is connected to the corresponding power supply line 42 through a contact hole (not shown), which overlaps with the power supply line 42. The first electrode 13a is connected to a drain of a switching TFT 11 and a gate of a driving TFT 12 through a low-resistance metal line, which is the same as that constituting the power supply line 42.

Such arrangement of the retention capacitor 13 can ensure a larger electric capacity than in the first embodiment.

The first film-forming region 7a according to the present embodiment is defined by a second partition 19 to include TFTs 11 and 12, the retention capacitor 13, and lines connecting the TFTs 11 and 12 with the retention capacitor 13 in a drive circuit unit on an element substrate 1. A pixel electrode 23b is disposed across the first film-forming region 7a defined by the second partition 19.

A first organic EL element 20B includes a pixel electrode 23b, a functional layer 24b, and a common electrode 27 in the first film-forming region 7a. The functional layer 24b and the common electrode 27 are stacked on the pixel electrode 23b. The functional layer 24b includes a hole-injection layer 25 and a first light-emitting layer 26b. The hole-injection layer 25 is formed by a coating method (a liquid discharge method). The first light-emitting layer 26b is formed by a vapor deposition method. The first light-emitting layer 26b has hole-transport characteristics and electron-transport characteristics.

As illustrated in FIG. 14, the second organic EL element 20G adjacent to the first organic EL element 20B includes the pixel electrode 23g, a functional layer 24g, and the common electrode 27. The functional layer 24g and the common electrode 27 are stacked on the pixel electrode 23g. The functional layer 24g includes the hole-injection layer 25, a second light-emitting layer 26g, and the first light-emitting layer 26b. The hole-injection layer 25 and the second light-emitting layer 26g are disposed in the second film-forming region 7b. The second film-forming region 7b is defined by an insulating layer 18 and a second partition 19 disposed on the insulating layer 18 so as not to include the TFTs 11 and 12 of the drive circuit unit disposed on the element substrate 1. The first light-emitting layer 26b is formed by a vapor deposition method to cover the second partition 19 and the second light-emitting layer 26g. The hole-injection layer 25 and the second light-emitting layer 26g are formed by a coating method (a liquid discharge method).

The adjacent third organic EL element 20R has the same cross-sectional structure as the second organic EL element 20G illustrated in FIG. 14. More specifically, the third organic EL element 20R includes a pixel electrode 23r, a functional layer 24r, and the common electrode 27. The functional layer 24r and the common electrode 27 are stacked on the pixel electrode 23r. The functional layer 24r includes the hole-injection layer 25, a third light-emitting layer 26r, and the first light-emitting layer 26b. The hole-injection layer 25 and the third light-emitting layer 26r are disposed in the third film-forming region 7c. The third film-forming region 7c is defined by the insulating layer 18 and the second partition 19 disposed on the insulating layer 18 so as not to include the TFTs 11 and 12 of the drive circuit unit disposed on the element substrate 1. The first light-emitting layer 26b is formed by a vapor deposition method to cover the second partition 19 and the third light-emitting layer 26r. The hole-injection layer 25 and the third light-emitting layer 26r are formed by a coating method (a liquid discharge method).

As illustrated in FIG. 14, the second film-forming region 7b is defined by the insulating layer 18 and the second partition 19 disposed on the insulating layer 18 in a region of the underlying layer in which the retention capacitor 13 having a substantially flat surface and the corresponding power supply line 42 are formed. Thus, the top surface is flat as in the first embodiment. Thus, the hole-injection layer 25 and the second light-emitting layer 26g each having an almost constant thickness (cross-sectional shape) can be formed in the second film-forming region 7b by a coating method (a liquid discharge method). The third film-forming region 7c including the hole-injection layer 25 and the third light-emitting layer 26r in the third organic EL element 20R is similar to the second film-forming region 7b.

The organic EL device 200 can be manufactured by the method for manufacturing the organic EL device 100 according to the first embodiment.

In addition to the advantages of the first embodiment, the second embodiment has the following advantages.

1) The organic EL device 200 includes the retention capacitor 13 of the drive circuit unit in the underlying layer in the second film-forming region 7b and the third film-forming region 7c defined by the second partition 19. The retention capacitor 13 has almost the same area as the second film-forming region 7b and the third film-forming region 7c. Thus, the retention capacitor 13 can have a larger electric capacity than in the first embodiment.

2) The power supply lines 42 have a large width across the second film-forming region 7b and the third film-forming region 7c along the scanning lines 31. Thus, the power supply lines 42 can more stably supply a driving current to the organic EL elements 20B, 20G, and 20R with a smaller loss than in the first embodiment.

Furthermore, the power supply lines 42 are disposed in a region including the retention capacitor 13 on the element substrate 1. The underlying layer in the second film-forming region 7b and the third film-forming region 7c can therefore have a flat surface.

Third Embodiment

Figure 15:
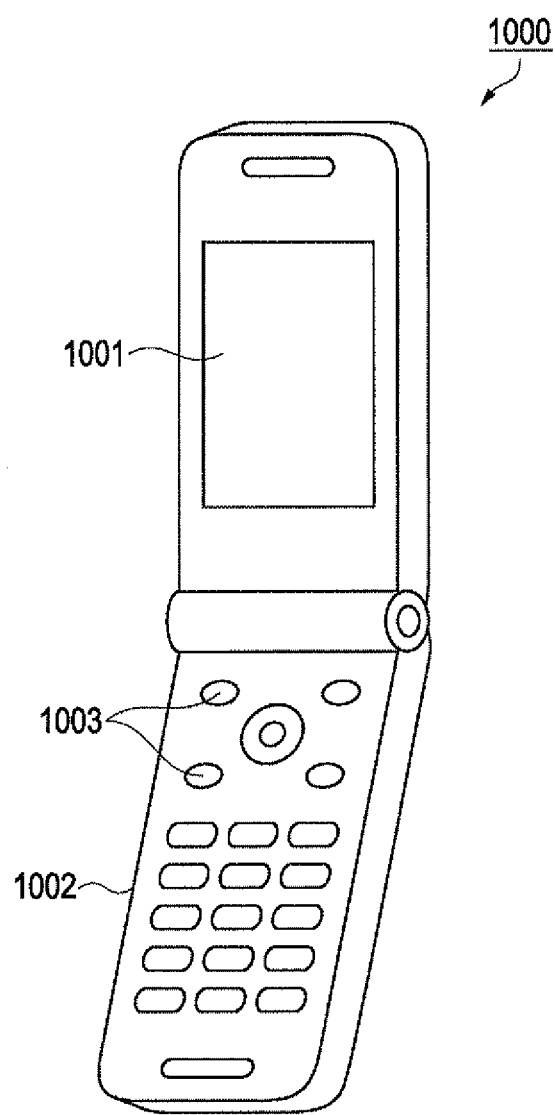
FIG. 15 is a schematic perspective view of a mobile phone as an example of an electronic device.

An electronic device according to the present embodiment will be described below with reference to FIG. 15. FIG. 15 is a schematic perspective view of a mobile phone as an example of an electronic device.

As illustrated in FIG. 15, a mobile phone 1000 as an electronic device according to the present embodiment includes a main body 1002 having operating buttons 1003 and a display 1001 attached to the main body 1002 with a hinge.

The display 1001 includes the organic EL device 100 or 200 according to any of the preceding embodiments.

Variations in luminance resulting from variations in the thickness of the light-emitting layers 26b, 26g, and 26r are therefore reduced in the mobile phone 1000. Thus, the mobile phone 1000 can display clear images in full color.

An electronic device including the organic EL device 100 or 200 is not limited to the mobile phone 1000. Examples of the electronic device include electronic devices having a display, such as personal computers, personal digital assistants, navigators, and viewers.

In addition to these embodiments, various modified embodiments can be envisaged. Some modified embodiments will be described below.

First Modified Embodiment

Figure 16:
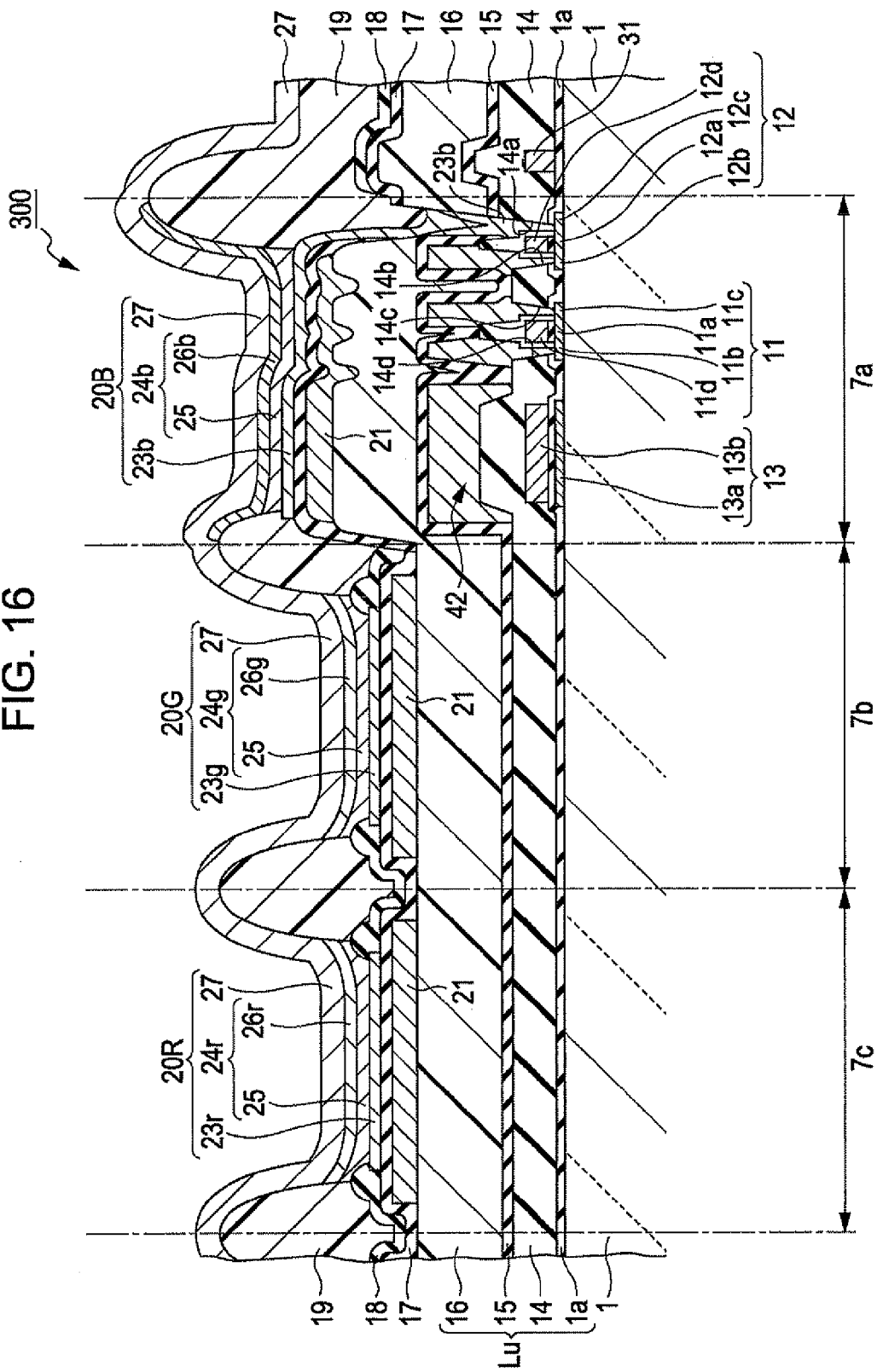
FIG. 16 is a schematic cross-sectional view of an organic EL device according to a modified embodiment.

In the organic EL device 100 according to the first embodiment, the blue-light-emitting layer 26b formed by a vapor deposition method does not necessarily cover the light-emitting layers 26g and 26r. FIG. 16 is a schematic cross-sectional view of an organic EL device 300 according to this modified embodiment. FIG. 16 corresponds to the schematic cross-sectional view of FIG. 6 illustrating the structure of the organic EL device 100. In the organic EL device 300, the first light-emitting layer 26b is formed by a vapor deposition method only in the first film-forming region 7a by using a deposition mask covering portions other than the first film-forming region 7a. Although this structure and a manufacturing method thereof involve inconvenient selective formation of the first light-emitting layer 26b, light-emitting layers of different luminescent colors are not stacked, and light having an intended peak wavelength can therefore be relatively easily obtained.

Second Modified Embodiment

Figure 17:
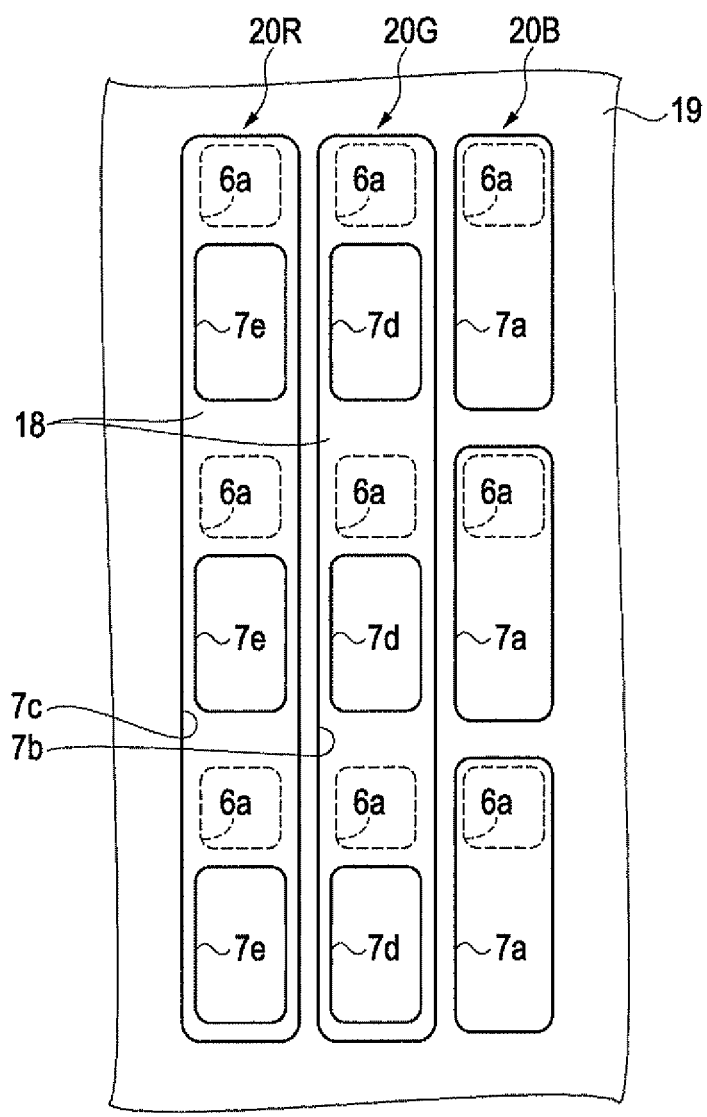
FIG. 17 is a schematic plan view illustrating partition of a film-forming region in a modified embodiment.

In the organic EL device 100 according to the first embodiment, the first film-forming region 7a, the second film-forming region 7b, and the third film-forming region 7c defined by the second partition 19 do not necessarily correspond to the functional layers 24b, 24g, and 24r of different luminescent colors. FIG. 17 is a schematic plan view illustrating partition of a film-forming region in this modified embodiment. For example, a film-forming region 7d (a substantial light-emitting region) including the hole-injection layer 25 and the second light-emitting layer 26g of the functional layer 24g is defined by an insulating layer 18 serving as a first partition such that the area 6a of the underlying layer in which at least part of the drive circuit unit is disposed is excluded. The second film-forming region 7b is defined by a second partition 19 such that the second film-forming region 7b includes a plurality of (three in FIG. 17) film-forming regions 7d. The same applies to the third film-forming region 7c. More specifically, a film-forming region 7e (a substantial light-emitting region) including the hole-injection layer 25 and the third light-emitting layer 26r of the functional layer 24r is defined by an insulating layer 18. The third film-forming region 7c is defined by the second partition 19 such that the third film-forming region 7c includes a plurality of (three in FIG. 17) film-forming regions 7e.

This allows a liquid 60 containing a material for a hole-injection layer and liquids 70G and 70R containing a material for a light-emitting layer to be applied to a larger area than the first embodiment, proving the hole-injection layer 25 and the light-emitting layers 26g and 26r having smaller variations in thickness after drying.

The present modified embodiment is preferably applied to the second film-forming region 7b and the third film-forming region 7c in which at least part of the functional layers 24g and 24r are formed by coating. The present modified embodiment may also be applied to only one of the second film-forming region 7b and the third film-forming region 7c. It goes without saying that the second film-forming region 7b and the third film-forming region 7c do not necessarily include three film-forming regions 7d and 7e, respectively. The second film-forming region 7b or the third film-forming region 7c may include all the film-forming regions 7d or the film-forming regions 7e of the same luminescent color.

The present modified embodiment can also be applied to the first film-forming region 7a in which at least part (the hole-injection layer 25) of the functional layer 24b is formed by coating.

Third Modified Embodiment

The sealing substrate in the organic EL device 100 according to the first embodiment and the organic EL device 200 according to the second embodiment may have another structure. For example, the sealing substrate may include color filters corresponding to each luminescent color of the organic EL elements 20B, 20G, and 20R. This can provide a top-emission full-color display having excellent color reproducibility.

Fourth Modified Embodiment

In the method for manufacturing the organic EL device 100 according to the first embodiment, if the second film-forming region 7b and the third film-forming region 7c have different areas, variations in film shape may occur owing to a difference in drying speed, because drying after application in the step of forming a light-emitting layer proceeds faster with a decrease in the area. It is therefore desirable that the liquids 70G and 70R be applied in descending order of area. This can reduce a difference in drying speed between the second film-forming region 7b and the third film-forming region 7c, providing the light-emitting layers 26g and 26r having a consistent shape.

Fifth Modified Embodiment

In the step of forming a light-emitting layer in the method for manufacturing the organic EL device 100 according to the first embodiment, when the different liquids 70G and 70R are applied to the second film-forming region 7b and the third film-forming region 7c, a liquid applied later may have low wettability for the film-forming region. It is therefore desirable that the different liquids 70G and 70R be applied in ascending order of wettability for the film-forming region. This can reduce a loss in the wettability of the liquids 70G and 70R for the film-forming region, allowing the liquids 70G and 70R to be uniformly applied.

Sixth Modified Embodiment

In the method for manufacturing the organic EL device 100 according to the first embodiment, if the liquid 70G or 70R contains a material for a light-emitting layer that is easily deactivated, for example, by exposure to water or oxygen or heating, it is desirable that such a liquid be applied last. This can improve yield.

The entire disclosure of Japanese Patent Application No. 2009-252710, filed Nov. 4, 2009 is expressly incorporated by reference herein.

The invention claimed is:

1. An organic Electroluminescent (EL) device comprising:
a first organic EL element, a second organic EL element, and a third organic EL element of different luminescent colors disposed adjacent to each other on an underlying layer including a substrate,
the underlying layer including a first drive circuit unit for driving the first organic EL element, a second drive circuit unit for driving the second organic EL element, and a third drive circuit unit for driving the third organic EL element; and
a partition defining a first film-forming region, a second film-forming region, and a third film-forming region on the underlying layer, the first film-forming region including a first light-emitting layer of the first organic EL element, the second film-forming region including a second light-emitting layer of the second organic EL element, and the third film-forming region including a third light-emitting layer of the third organic EL element,
the partition defining the first film-forming region such that the first film-forming region includes the first drive circuit unit, the second film-forming region such that the second film-forming region does not include at least part of the second drive circuit unit, and the third film-forming region such that the third film-forming region does not include at least part of the third drive circuit unit,
each of the first drive circuit unit, the second drive circuit unit, and the third drive circuit unit including a thin-film transistor, a retention capacitor, and a line connected between the thin-film transistor and the retention capacitor,
the partition defining the second film-forming region and the third film-forming region such that the second film-forming region and the third film-forming region do not include at least the thin-film transistor, and
the first light-emitting layer being formed by a different method from that used for the second light-emitting layer and the third light-emitting layer.

2. The organic EL device according to claim 1, wherein the second light-emitting layer and the third light-emitting layer are formed by a liquid discharge method, the second light-emitting layer emitting green light, the third light-emitting layer emitting red light, and
the first light-emitting layer is formed by a vapor deposition method on the second light-emitting layer and the third light-emitting layer, the first light-emitting layer emitting blue light.

3. The organic EL device according to claim 2, wherein the first light-emitting layer has hole-transport characteristics.

4. The organic EL device according to claim 2, wherein the first light-emitting layer has hole-transport characteristics and electron-transport characteristics.

5. The organic EL device according to claim 1, wherein the partition defines the first film-forming region such that the first film-forming region has a larger area than each of the second film-forming region and the third film-forming region.

6. The organic EL device according to claim 5, wherein the partition includes a first partition formed of an inorganic material and a second partition formed of an organic material,
the first film-forming region is defined by the second partition alone, and
the second film-forming region and the third film-forming region are individually defined by the second partition disposed on the first partition.

7. The organic EL device according to claim 5, wherein the partition includes a first partition formed of an inorganic material and a second partition formed of an organic material,
the first film-forming region is defined by the second partition alone, and
a substantial light-emitting region of at least one of the second film-forming region and the third film-forming region is defined by the first partition, and the second partition is disposed on the first partition to include a plurality of light-emitting regions.

8. The organic EL device according to claim 1, wherein
each of the first drive circuit unit, the second drive circuit unit, and the third drive circuit unit includes a thin-film transistor, a retention capacitor, and a line connected between the thin-film transistor and the retention capacitor, and the partition defines the second film-forming region and the third film-forming region such that the second film-forming region and the third film-forming region include neither the thin-film transistor nor the retention capacitor.

9. A method for manufacturing an organic Electroluminescent (EL) device that includes a first organic EL element, a second organic EL element, and a third organic EL element of different luminescent colors disposed adjacent to each other on an underlying layer including a substrate, the method comprising:

forming a first drive circuit unit for driving the first organic EL element, a second drive circuit unit for driving the second organic EL element, and a third drive circuit unit for driving the third organic EL element on the substrate;

forming a partition that defines a first film-forming region, a second film-forming region, and a third film-forming region on the substrate, the first film-forming region including the first drive circuit unit, the second film-forming region not including at least part of the second drive circuit unit, the third film-forming region not including at least part of the third drive circuit unit, and forming a first light-emitting layer of the first organic EL element in the first film-forming region, forming a second light-emitting layer of the second organic EL element in the second film-forming region, and forming a third light-emitting layer of the third organic EL element in the third film-forming region, the first light-emitting layer being formed by a different method from that used for the second light-emitting layer and the third light-emitting layer, each of the first drive circuit unit, the second drive circuit unit, and the third drive circuit unit including a thin-film transistor, a retention capacitor, and a line connected between the thin-film transistor and the retention capacitor, and the partition defining the second film-forming region and the third film-forming region such that the second film-forming region and the third film-forming region do not include at least the thin-film transistor.

10. The method for manufacturing an organic EL device according to claim 9, wherein the second light-emitting layer and the third light-emitting layer are formed by a liquid discharge method, and the first light-emitting layer is formed by a vapor deposition method to cover the second light-emitting layer and the third light-emitting layer, the second light-emitting layer emitting green light, the third light-emitting layer emitting red light, the first light-emitting layer emitting blue light.

11. The method for manufacturing an organic EL device according to claim 10, wherein the first light-emitting layer has hole-transport characteristics and electron-transport characteristics and is formed by a vapor deposition method.

12. The method for manufacturing an organic EL device according to claim 9, wherein the partition is formed such that the first film-forming region has a larger area than each of the second film-forming region and the third film-forming region.

13. The method for manufacturing an organic EL device according to claim 12, wherein
the partition includes a first partition formed of an inorganic material and a second partition formed of an organic material,
the first partition defines the second film-forming region and the third film-forming region, and the second partition is disposed on the first partition, and
the second partition defines the first film-forming region.

14. The method for manufacturing an organic EL device according to claim 12, wherein
the partition includes a first partition formed of an inorganic material and a second partition formed of an organic material,
the second partition defines the first film-forming region,
the first partition defines a substantial light-emitting region of at least one of the second film-forming region and the third film-forming region, and
the second partition is disposed on the first partition to include a plurality of light-emitting regions.

15. The method for manufacturing an organic EL device according to claim 9, wherein
each of the first drive circuit unit, the second drive circuit unit, and the third drive circuit unit includes a thin-film transistor, a retention capacitor, and a line connected between the thin-film transistor and the retention capacitor, and
the partition defines the second film-forming region and the third film-forming region such that the second film-forming region and the third film-forming region include neither the thin-film transistor nor the retention capacitor.

16. An electronic device, comprising an organic EL device according to claim 1.

* * * * *